(12) United States Patent
Yoneyama et al.

(10) Patent No.: US 10,785,846 B2
(45) Date of Patent: Sep. 22, 2020

(54) ILLUMINATION DEVICE

(71) Applicant: Konica Minolta, Inc., Tokyo (JP)

(72) Inventors: Masatoshi Yoneyama, Izumi (JP); Kazuyoshi Omata, Kofu (JP); Tsukasa Yagi, Kobe (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/331,098

(22) PCT Filed: Aug. 15, 2017

(86) PCT No.: PCT/JP2017/029360
§ 371 (c)(1),
(2) Date: Mar. 6, 2019

(87) PCT Pub. No.: WO2018/051708
PCT Pub. Date: Mar. 22, 2018

(65) Prior Publication Data
US 2019/0239311 A1    Aug. 1, 2019

(30) Foreign Application Priority Data

Sep. 13, 2016  (JP) .................................. 2016-178542

(51) Int. Cl.
*G06F 3/044* (2006.01)
*H05B 47/115* (2020.01)
(Continued)

(52) U.S. Cl.
CPC ............... *H05B 47/10* (2020.01); *F21S 2/00* (2013.01); *F21V 23/00* (2013.01); *F21V 23/04* (2013.01);
(Continued)

(58) Field of Classification Search
CPC .................................................. H03K 17/962
See application file for complete search history.

(56) References Cited

U.S. PATENT DOCUMENTS

| 8,638,314 B2* | 1/2014 | Sleeman | ............... G06F 3/0412 |
| | | | 178/18.01 |
| 9,965,125 B2* | 5/2018 | Tamaki | ................. H01L 27/323 |
| 2015/0084006 A1 | 3/2015 | Ivanov | |

FOREIGN PATENT DOCUMENTS

| CN | 1615585 A | 5/2005 |
| CN | 103842947 A | 6/2014 |
| (Continued) | | |

OTHER PUBLICATIONS

Extended European Search Report dated Jun. 25, 2019 issued for the corresponding European Patent Application No. 17850614.3 (13 pages).

(Continued)

*Primary Examiner* — Henry Luong
(74) *Attorney, Agent, or Firm* — Lucas & Mercanti, LLP

(57) ABSTRACT

An illumination device is provided with: a planar first electrode; a planar second electrode arranged to face the first electrode; a light emitting layer which is disposed between the first electrode and the second electrode and emits light in accordance with a current flowing between the first electrode and the second electrode; a first sensor that is electrically connected to the first electrode and detects an electrostatic capacitance of the first electrode; and a second sensor that is electrically connected to the second electrode and detects an electrostatic capacitance of the second electrode.

15 Claims, 21 Drawing Sheets

(51) Int. Cl.
*H05B 47/10* (2020.01)
*F21S 2/00* (2016.01)
*G06F 3/041* (2006.01)
*F21V 23/00* (2015.01)
*H03K 17/96* (2006.01)
*H05B 45/00* (2020.01)
*F21V 23/04* (2006.01)
*H01L 51/50* (2006.01)

(52) U.S. Cl.
CPC .......... *G06F 3/041* (2013.01); *H01L 51/5012* (2013.01); *H03K 17/962* (2013.01); *H05B 45/60* (2020.01); *H01L 51/50* (2013.01)

(56) References Cited

FOREIGN PATENT DOCUMENTS

| | | |
|---|---|---|
| JP | 2008-159594 A | 7/2008 |
| JP | 2010-529546 A | 8/2010 |
| JP | 2011-514700 A | 5/2011 |
| KR | 2014-0104343 A | 8/2014 |
| KR | 2016-0039231 A | 4/2016 |
| WO | 03/044956 A2 | 5/2003 |
| WO | WO2015182001 A1 | 12/2015 |

OTHER PUBLICATIONS

International Search Report dated Oct. 17, 2017 from the corresponding International Application No. PCT/JP2017/029360 and English translation.

KIPO, Office Action for the corresponding Korean Patent Application No. 10-2019-7009134, dated Dec. 12, 2019, with English translation.

CNIPA, Office Action for the corresponding Chinese patent application No. 201780055540.1, dated Dec. 27, 2019, with English translation.

CNIPA, Office Action for the corresponding Chinese patent application No. 201780055540.1, issued Jul. 14, 2020, with English translation.

* cited by examiner

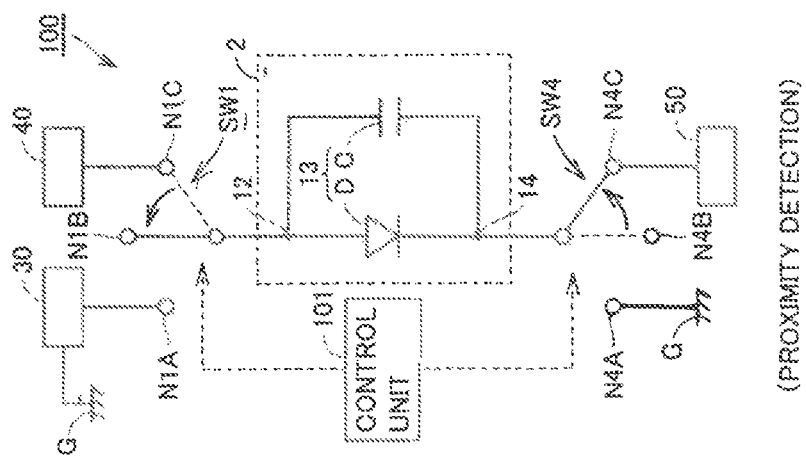
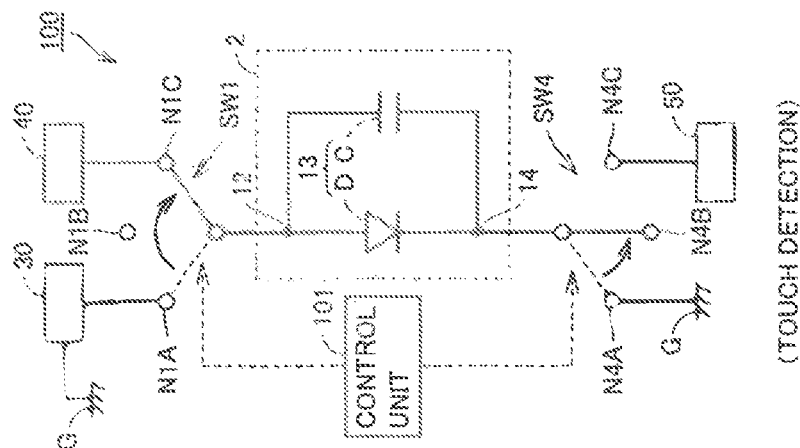
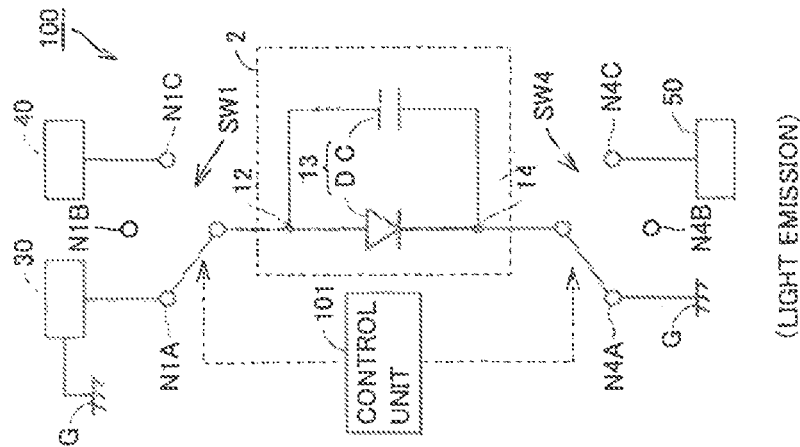

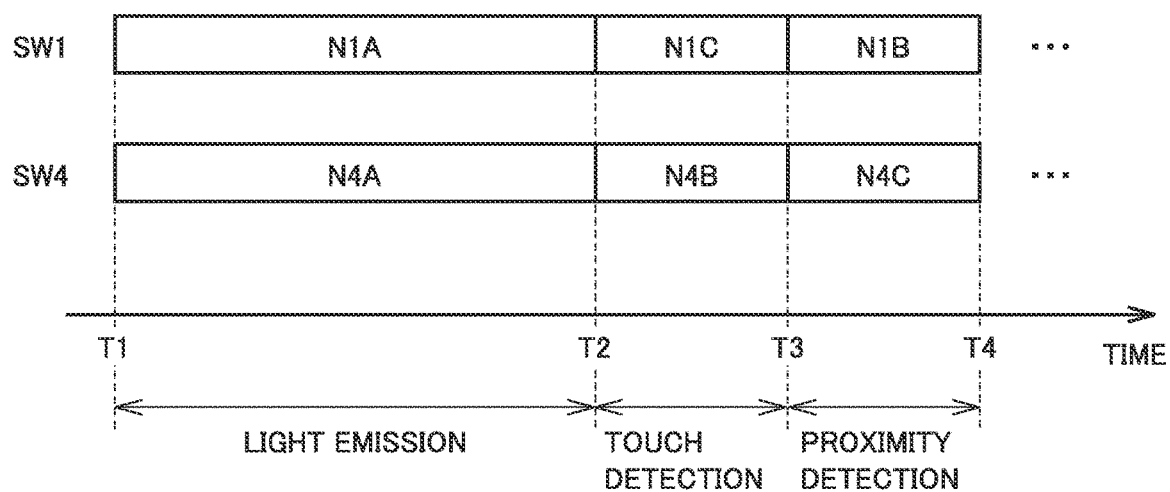

ILLUMINATION DEVICE

This is the US National Stage of Application No. PCT/JP2017/029360 filed on Aug. 15, 2017. Japanese Patent Application No. 2016-178542 filed on Sep. 13, 2016 including description, claims, drawings, and abstract, the entire disclosure is incorporated herein by reference in its entirety.

TECHNOLOGICAL FIELD

The present disclosure relates to an illumination device, and more particularly to a planar illumination device.

BACKGROUND

Planar illumination devices such as OLED (Organic Light Emitting Diode) are spreading. Regarding a planar illumination device, International Publication No. 2015/182001 (Patent literature 1) discloses an illumination device having a touch detection function. In the illumination device, a pair of planar electrodes is provided with a light-emitting layer interposed therebetween. A touch detection circuit is connected to one of the electrodes. The touch detection circuit detects a touch operation based on a change in electrostatic capacitance of the illumination device caused by the user touching the illumination device.

CITATION LIST

Patent Literature

PTL 1: International Publication No. 2015/182001

DESCRIPTION OF THE RELATED ART

An illumination device having not only a touch detection function but also a proximity detection function is desired. Since the illumination device has both the touch detection function and the proximity detection function, it is possible to change the light emission mode between the case where the user's touch operation is detected and the case where the user's proximity is detected. In order to change the light emission mode according to the user's operation, it is necessary to provide a plurality of detection circuits for detecting the change in electrostatic capacitance of the illumination device. Since the illumination device disclosed in PTL 1 comprises only one touch detection circuit, it is not possible to change the light emission mode according to the user operation. Therefore, an illumination device capable of detecting changes in electrostatic capacitance with different sensitivities is desired.

SUMMARY

According to one aspect, an illumination device comprises a planar first electrode, a planar second electrode arranged to face the first electrode, a light emitting layer which is disposed between the first electrode and the second electrode and emits light in accordance with a current flowing between the first electrode and the second electrode, a first detection unit that is electrically connected to the first electrode and detects an electrostatic capacitance of the first electrode, and a second detection unit electrically connected to the second electrode and detecting a capacitance of the second electrode.

BRIEF DESCRIPTION OF THE DRAWINGS

FIGS. 4A to 4C are diagrams showing an example of a circuit configuration of an illumination device according to a first embodiment.

FIG. 5 is a diagram showing an example of a control sequence of an illumination device according to the first embodiment.

DETAILED DESCRIPTION OF EMBODIMENTS

Figure 1:
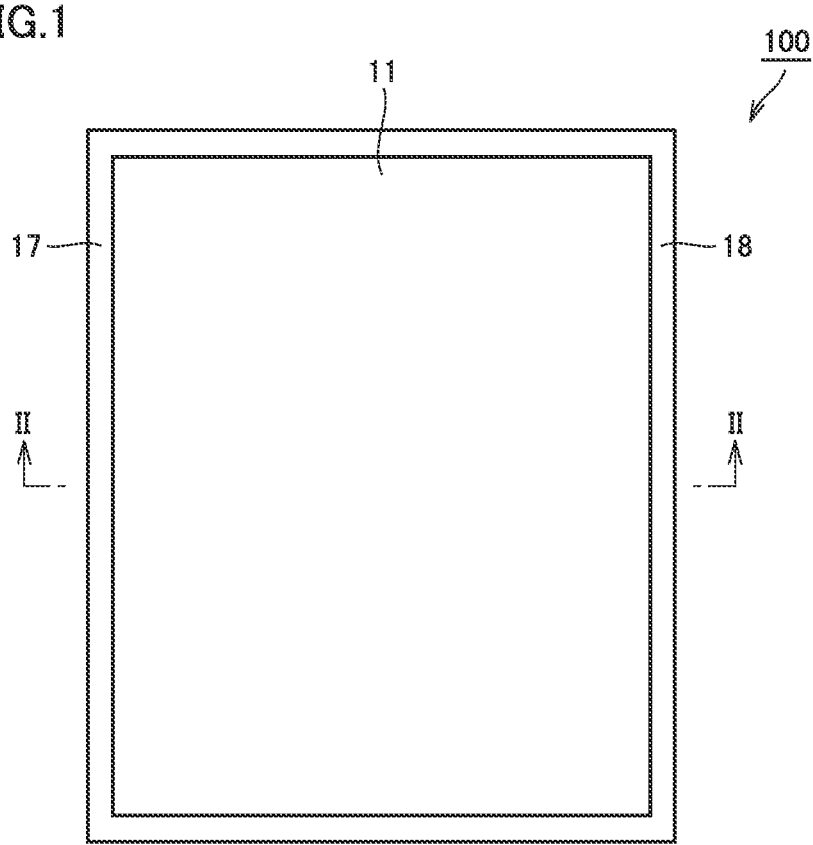
FIG. 1 is a plan view showing an illumination device according to a first embodiment.

Hereinafter, each embodiment according to the present invention will be described with reference to the drawings. In the following description, the same parts and constituent elements are denoted by the same reference numerals. Their names and functions are also the same. Therefore, detailed description of these will not be repeated. Note that each embodiment and each modification described below may be selectively combined as appropriate.

First Embodiment

[Illumination Device 100]

Figure 2:
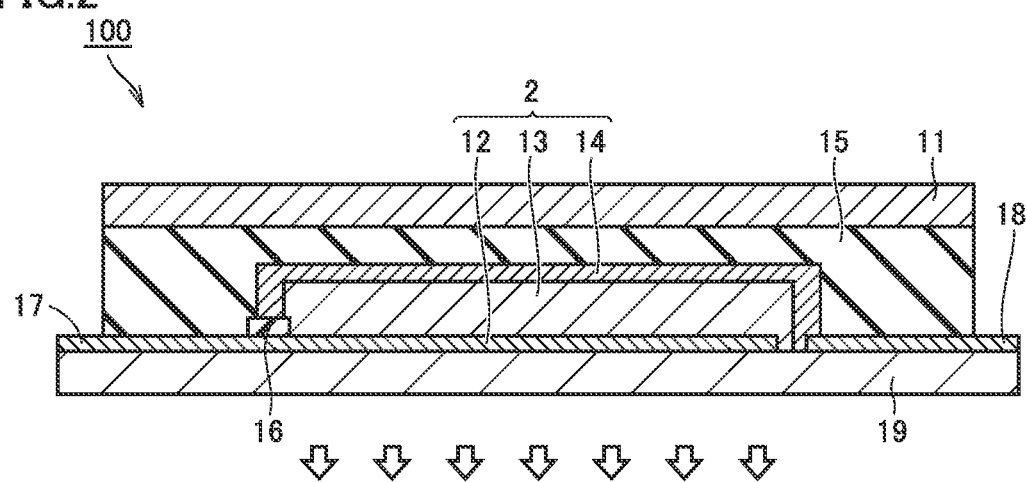
FIG. 2 is a cross-sectional view taken along the line II-II in FIG. 1.

With reference to FIG. 1 and FIG. 2, the illumination device 100 according to the first embodiment will be described. FIG. 1 is a plan view showing the illumination device 100. FIG. 2 is a cross-sectional view taken along the line II-II in FIG. 1.

As shown in FIGS. 1 and 2, the illumination device 100 comprises a light emitting panel 2, a metal layer 11, a sealing member 15, an insulating layer 16, and a transmitting member 19.

The light emitting panel 2 is a planar light emitting element, for example, an OLED. The light emitting panel 2 may be a bottom emission type organic EL (Electro Luminescence) element or a top emission type organic EL element. The light emitting panel 2 comprises an anode 12, a light emitting layer 13, and a cathode 14.

The anode 12 (anode electrode) is a conductive film having transparency. The anode 12 is formed, for example, by depositing ITO (Indium Tin Oxide) on the transmitting member 19. The ITO film for forming the anode 12 is divided into two regions by patterning in order to form the connection terminal 17 of the anode 12 and the connection terminal 18 of the cathode 14. The ITO film of the connection terminal 18 is connected to the cathode 14 (cathode electrode). The cathode 14 is, for example, aluminum.

The light emitting layer 13 is disposed between the anode 12 (first electrode) and the cathode 14 (second electrode). The light emitting layer 13 emits light by receiving a current supply from a power source 30 (see FIG. 3), which will be described later, which is electrically connected to the connection terminal 17 of the anode 12 and the connection terminal 18 of the cathode 14. The light from the light emitting layer 13 passes through the anode 12 and the transmitting member 19 and is irradiated to the outside.

The sealing member 15 is made of a thin film glass, a resin flint, or the like. The sealing member 15 seals the anode 12, the light emitting layer 13, and the cathode 14. The sealing member 15 is covered with the metal layer 11.

The insulating layer 16 is provided between the cathode 14 and the anode 12. A portion of the cathode 14 on the side opposite to the side where the insulating layer 16 is positioned is connected to the connection terminal 18.

[Touch Detection Function and Proximity Detection Function]

Figure 3:
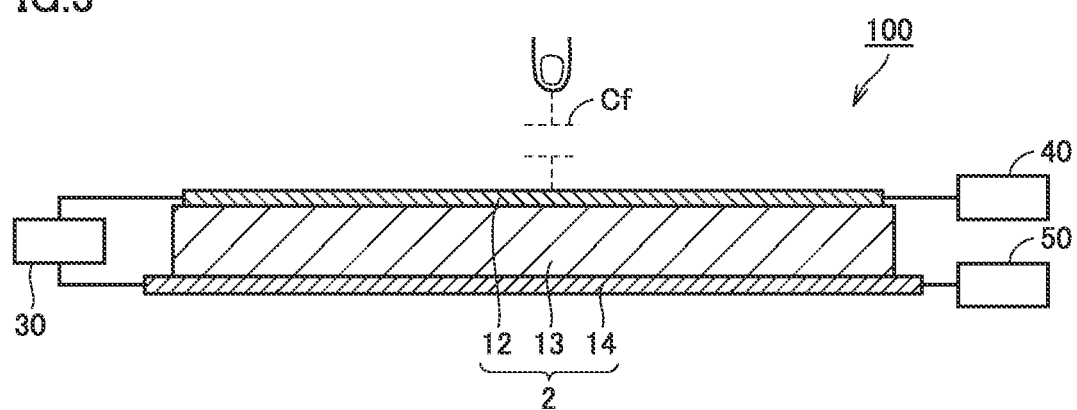
FIG. 3 is a diagram showing a main configuration for realizing the touch detection function and the proximity detection function in an illumination device according to the first embodiment.

The illumination device 100 according to the present embodiment has a function of detecting the touch operation by the user and a function of detecting the proximity of the user. With reference to FIG. 3, a touch detection function and a proximity detection function of the illumination device 100 will be described. FIG. 3 is a diagram showing a main configuration for realizing the touch detection function and the proximity detection function in the illumination device 100.

As shown in FIG. 3. The illumination device 100 comprises a light emitting panel 2, a power source 30, a detection circuit 40 for detecting a touch operation, and a detection circuit 50 for detecting proximity of the user.

The power source 30 is electrically connected to the anode 12 and the cathode 14 and supplies a current to the light emitting layer 13 disposed between the anode 12 and the cathode 14. The power source 30 is a constant current source for supplying a constant current to the light emitting layer 13.

The detection circuit 40 (first sensor) is electrically connected to the anode 12, and detects a change in electrostatic capacitance of the anode 12. The detection circuit 40 is a capacitance type touch sensor that detects a touch operation on the illumination device 100 based on a change in the electrostatic capacitance of the anode 12.

The electrostatic capacitance method will be described. The human body contains much moisture and has conductivity. Therefore, when the user's finger approaches the anode 12, an electrostatic capacitance Cf is generated between the finger and the anode 12. As a result, the electrostatic capacitance between the finger and the anode 12 changes. The detection circuit 40 detects a touch operation by the user on the basis that the electrostatic capacitance between the anode 12 and the finger has changed by a predetermined amount or more.

The detection circuit 50 (second sensor) is electrically connected to the cathode 14, and detects a change in electrostatic capacitance of the cathode 14. The detection circuit 50 is a capacitance type touch sensor that detects the proximity of the operation body to the illumination device 100 based on the change in the electrostatic capacitance of the cathode 14. An operation body is a body part such as a user's finger. As an example, the operating body is a user's finger.

As with the anode 12, when the user's finger approaches the cathode 14, an electrostatic capacitance is generated between the finger and the cathode 14. As a result, the electrostatic capacitance of the cathode 14 changes. The change in electrostatic capacitance increases as the finger of the user approaches the cathode 14 and becomes the maximum when the user's finger touches the cathode 14. Focusing on this point, the detection circuit 50 detects the change of the electrostatic capacitance of the cathode 14 with sensitivity different from that of the detection circuit 40, and detects the proximity of the user.

More specifically, the detection circuit 50 for proximity detection detects the proximity of the user based on the fact that the change amount of the electrostatic capacitance of the cathode 14 exceeds the first threshold value. On the other hand, the detection circuit 40 for touch detection detects the touch operation by the user based on the fact that the change amount of the electrostatic capacitance of the anode 12 exceeds the second threshold value (>the first threshold value). In this way, the detection circuit 40 can detect the touch operation and the detection circuit 50 can detect the proximity of the user by the detection circuit 40, 50 detecting the change in the electrostatic capacitance with different sensitivities. In addition, since the anode 12 is shared for light emission and touch detection and the cathode 14 is shared for light emission and proximity detection, it is not necessary to newly provide electrodes for touch detection and proximity detection. Thereby, the configuration of the illumination device 100 is simplified, and the thinning of the illumination device 100 is realized. In addition, the cost of the illumination device 100 is reduced.

In order to detect that the user approaches the illumination device 100 in a wider range, it is preferable that the area of the cathode 14 for proximity detection is large. Therefore, preferably, the area of the cathode 14 for proximity detection is larger than the area of the anode 12 for touch detection.

In the above description, the example in which the detection circuit 40 is used for touch detection and the detection circuit 50 is used for proximity detection has been described, but the use of the detection circuits 40, 50 is not limited to these. In one aspect, the detection circuits 40, 50 are both used for touch detection. In this case, the detection circuit 40 functions as a capacitance type touch sensor that detects a touch operation on the illumination device 100 based on a change in the electrostatic capacitance of the anode 12, the detection circuit 50 functions as a capacitance type touch sensor that detects a touch operation on the illumination device 100 based on a change in the electrostatic capacitance of the cathode 14. Thereby, the illumination device 100 can change the light emission mode according to the difference in the touch position. In another aspect, the detection circuits 40, 50 are both used for proximity detection. In this case, the detection circuit 40 functions as an electrostatic capacitance type proximity sensor that detects the proximity of the operating body based on the change in the electrostatic capacitance of the anode 12, The detection circuit 50 functions as an electrostatic capacitance type proximity sensor that detects the proximity of the operating body based on the change in the electrostatic capacitance of the cathode 14. Thereby, the illumination device 100 can change the light emission mode according to the difference in how the user approaches.

In the above description, example about that proximity of the user is detected based on the fact that the amount of change in the electrostatic capacitance of the anode 12 exceeds the first threshold value, and touch operation of the user is detected based on the amount of change in electrostatic capacitance of the cathode 14 is greater than the second threshold value (>first threshold value) is described. However, the magnitude relation of the first and second threshold values is not limited to the above example. The amount of change in the electrostatic capacitance when the finger of the user approaches the illumination device 100 increases as the area of the electrode increases. Therefore, if the areas of the anode 12 and the cathode 14 are different, even if the same threshold value is set in the detection circuits 40, 50, the sensitivity of the detection circuits 40, 50 differs. Focusing on this point, the sensitivity of the touch detection by the detection circuit 40 and the sensitivity of the proximity detection by the detection circuit 50 may be changed depending on the areas of the anode 12 and the cathode 14.

For touch detection or proximity detection based on electrostatic capacitance, a self-capacitance method for measuring the electrostatic capacitance between the detection electrode and the ground may be adopted, A mutual capacitance method for measuring the electrostatic capacitance between the detection electrode and another conductive member may be adopted. The touch operation or the proximity of the operation body is detected based on the change in the electrostatic capacitance detected by the self-capacitance method or the mutual capacitance method.

[Control Sequence]

The illumination device 100 sequentially switches at least two of the light emission period of the light emitting layer 13, the sensing period of the touch operation by the detection circuit 40 (first sensor), and the proximity sensing period by the detection circuit 50 (second sensor). Touch detection and proximity detection can be realized without the user feeling flickering of the light emission of the light emitting layer 13 by switching the light emission period, the touch sensing period, and the proximity sensing period at a high speed (for example, several tens of Hz or more). In addition, the time lag of the touch detection and the proximity detection is shortened, and the operability of the illumination dive 100 is improved.

Hereinafter, control sequences of light emission, touch detection, and proximity detection will be described with reference to FIGS. 4A to 4C and 5. FIGS. 4A to 4C are diagrams showing an example of a circuit configuration of the illumination device 100.

FIGS. 4A to 4C show an equivalent circuit of the light emitting panel 2 shown in FIGS. 2 and 3. In the light emitting panel 2 as an equivalent circuit, the anode 12 and the cathode 14 are represented by terminals (black dots in FIGS. 4A to 4C), and the light emitting layer 13 is represented by a parallel circuit of a light emitting diode D and a capacitor C.

A switch SW1 (first switch) is electrically connected to the anode 12. The switch SW1 can switch one of states among a state of electrically connecting the anode 12 to the power source 30, a state of electrically connecting the anode 12 to a contact N1B (first contact) of a predetermined electric potential, and a state of a state of electrically connecting the anode 12 to the detection circuit 40.

The switch SW1 is controlled by the control unit 101. The control unit 101 is constituted by, for example, at least one integrated circuit. The integrated circuit is configured by, for example, at least one CPU (Central Processing Unit), at least one ASIC (Application Specific Integrated Circuit), at least one FPGA (Field Programmable Crate Array), or a combination thereof.

The switch SW4 can switch one of states among a state of electrically connecting the cathode 14 to the ground G, the state of electrically connecting the cathode 14 to the contact N4B (second contact) of a predetermined electric potential, and the cathode 14 electrically connecting to the detection circuit 50.

FIG. 5 is a diagram showing an example of a control sequence of the illumination device 100 according to the first embodiment.

It is assumed that a light emission period arrives at time T1. As shown in FIG. 4 A, in the light emission period, the control unit 101 switches the switch SW1 to a state of electrically connecting the anode 12 to the power source 30 and switches to the state of electrically connecting the cathode 14 to the ground G. That is, the control unit 101 connects the switch SW1 to the contact N1A and connects the switch SW4 to the contact N4A. As a result, a current flow to the power source 30 to the anode 12 to the light emitting diode D to the cathode 14 to the ground G, and the light emitting panel 2 emits light. When the power source 30 is a constant current source, the light emitting panel 2 emits light with stable luminance.

It is assumed that the touch sensing period arrives at time T2. As shown in FIG. 4 B, in the touch sensing period, the control unit 101 switches the switch SW1 to a state in which the anode 12 is electrically connected to the detection circuit 40 and switches SW4 to a state in which the cathode 14 is electrically connected to the contact N4B. That is, the control unit 101 connects the switch SW1 to the contact N1C and connects the switch SW4 to the contact N4B. As a result, the anode 12 is connected to the touch detection circuit 40, and the cathode 14 is in a floating state. The floating state is a state in which it is connected to a predetermined electric potential (that is, a floating potential), and is a floating potential state not connected to the power source or the ground of the device. As a result, a channel of the detection circuit 40→the anode 12→the light emitting diode D→the cathode 14→the contact N4B becomes a state not connected to the ground G (that is, a floating state). At this time, when the user's finger approaches the illumination device 100, an electrostatic capacitance is generated between the finger and the anode 12, and the electrostatic capacitance of the anode 12 changes. The detection circuit 40 detects a touch operation by the user on the basis that the electrostatic capacitance of the anode 12 changes by a predetermined amount or more.

It is assumed that the proximity sensing period arrives at time T3. As shown in FIG. 4C, in the proximity sensing period, the control unit 101 switches the switch SW1 to a state in which the anode 12 is connected to the contact N1B of a predetermined electric potential and switches to the state in which the cathode 14 electrically connect to the detection circuit 50. That is, the control unit 101 connects the switch SW1 to the contact N1B and connects the switch SW4 to the contact N4C. As a result, the anode 12 is in a floating state, and the cathode 14 is connected to the detection circuit 50 for proximity detection. As a result, the path of the contact N1B→the anode 12→the light emitting diode D→the cathode 14→the detection circuit 50 is in a state not connected to the ground G (that is, a floating state). At this time, when the user's finger approaches the illumination device 100, an electrostatic capacitance is generated between the finger and the cathode 14, and the electrostatic capacitance of the cathode 14 changes. The detection circuit 50 detects the proximity of the user based on the fact that the electrostatic capacitance of the cathode 14 changes by a predetermined amount or more.

At the time T4, the light emission period again comes. After the time T4, the control unit 101 sequentially executes the light emission process, the touch detection process, and the proximity detection process again. In this manner, the control unit 101 repeatedly executes the light emission process, the touch detection process, and the proximity detection process.

In the above description, the control unit 101 sets the cathode 14 in the floating state in the touch sensing period, but the control unit 101 may place the anode 12 in a floating state in the touch sensing period. In the above description, the control unit 101 sets the anode 12 in a floating state in the proximity sensing period, but the control unit 101 may place the cathode 14 in a floating state in the proximity sensing period.

[Control Structure of Illumination Device 100]

Figure 6:
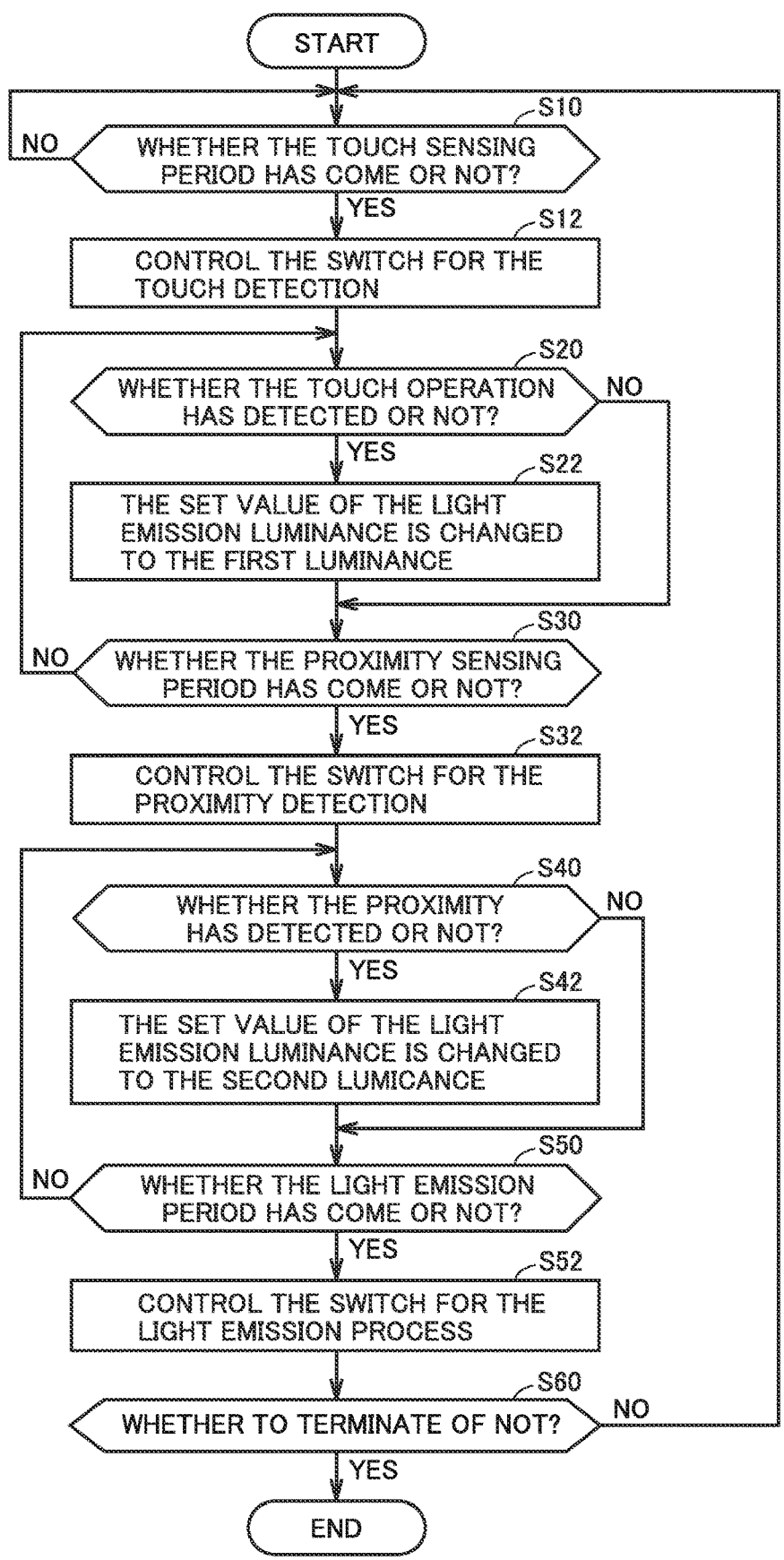
FIG. 6 is a flowchart showing a part of processing executed by an illumination device according to the first embodiment.

With reference to FIG. 6, a control structure of the illumination device 100 will be described. FIG. 6 is a flowchart showing a part of processing executed by the illumination device 100. The processing in FIG. 6 is realized by the control unit 101 (see FIGS. 4A to 4C) of the illumination device 100 executing the program. In other aspects, some or all of the processing may be performed by circuit elements or other hardware.

In step S10, the control unit 101 determines whether or not a touch sensing period has arrived. As an example, the control unit 101 determines that a touch sensing period has arrived when a predetermined time (for example, several tens of milliseconds) has elapsed since the start of the process of step S10. Alternatively, the control unit 101 determines that the touch sensing period has arrived when a predetermined time (for example, several tens ms) has elapsed since the control was switched from step S60 to step S10. When the control unit 101 determines that the touch sensing period has arrived (YES in step S10), it switches the control to step S12. Otherwise (NO in step S10), the control unit 101 executes the process of step S10 again.

In step S12, the control unit 101 controls the switches SW1 and SW4 (see FIGS. 4A to 4C) for touch detection. More specifically, the control unit 101 switches the switch SW1 so as to connect the anode 12 to the detection circuit 40 for touch detection and switches the switch SW4 so as to connect the cathode 14 to the contact N4B having a predetermined electric potential.

In step S20, the detection circuit 40 for touch detection determines whether touch operation is detected or not. As an example, the detection circuit 40 determines that a touch operation has been detected when the amount of change in the electrostatic capacitance of the anode 12 changes by a predetermined amount or more. When it is determined that the touch operation has been detected (YES in step S20), the detection circuit 40 switches the control to step S22. Otherwise (NO in step S20), the detection circuit 40 switches the control to step S30.

In step S22, the control unit 101 changes the setting value of the luminance of the light emitting panel 2 to the first luminance. The value of the first luminance is preset by the designer or the user. When the processing of step S22 is executed, the setting value of the luminance of the light emitting panel 2 is only changed, and the luminance of the light emitting panel 2 is changed in the light emission period in step S52 to be described later.

In step S30, the control unit 101 determines whether the proximity sensing period has arrived or not. As an example, the control unit 101 determines that the proximity sensing period has arrived when a predetermined time (for example, several tens ms) has elapsed since the start of the touch sensing period. When the control unit 101 determines that the proximity sensing period has arrived (YES in step S30), the control unit 101 switches the control to step S32. Otherwise (NO in step S30), the control unit 101 returns control to step S20.

In step S32, the control unit 101 controls the switches SW1 and SW4 (see FIGS. 4A to 4C) for proximity detection. More specifically, in the proximity sensing period, the control unit 101 switches the switch SW1 so as to connect the anode 12 to the contact N1B of a predetermined electric potential, and switches so as to connect the cathode 14 to the detection circuit 50 for proximity detection.

In step S40, the detection circuit 50 for proximity detection determines whether proximity of the user to the illumination device 100 is detected. As an example, the detection circuit 50 determines that proximity of the user has been detected when the amount of change in the electrostatic capacitance of the cathode 14 varies by a predetermined amount or more. When the detection circuit 50 determines that proximity of the user is detected (YES in step S40), the detection circuit 50 switches the control to step S42. Otherwise (NO in step S40), the detection circuit 50 switches the control to step S50.

In step S42, the control unit 101 sets the luminance setting value of the light emitting panel 2 to the second luminance. The value of the second luminance is preset by the designer or the user. At the time when the processing of step S42 is executed, only the setting value of the luminance of the light emitting panel 2 is changed, and the luminance of the light emitting panel 2 is changed to the light emission period in the later-described step S52.

In step S50, the control unit 101 determines whether or not the illumination period has arrived. As an example, the control unit 101 determines that the illumination period has arrived when a predetermined time (for example, several tens ms) has elapsed since the proximity sensing period was started. When the control unit 101 determines that the illumination period has arrived (YES in step S50), the control unit 101 switches the control to step S52. Otherwise (NO in step S50), the control unit 101 returns control to step S40.

In step S52, the control unit 101 controls the switches SW1 and SW4 (see FIGS. 4A to 4C) for illumination processing. More specifically, the control unit 101 switches the switch SW1 so as to connect the anode 12 to the power source 30 and switches so as to connect the cathode 14 to the ground G. At this time, when the touch operation is detected in step S20, the control unit 101 turns on the light emitting panel 2 with the first luminance set in step S22. When proximity of the user is detected in step S40, the control unit 101 turns on the light emitting panel 2 with the second luminance set in step S42. The control unit 101 adjusts the luminance of the light emitting panel 2 by adjusting the current value output from the power source 30.

In step S60, the control unit 101 determines whether or not to terminate the control process according to the present embodiment. As an example, the control unit 101 determines to terminate the control process according to the present embodiment when accepting the power-off operation from the user. When it is determined that the control process according to the present embodiment is to be terminated (YES in step S60), the control unit 101 terminates the process shown in FIG. 6. Otherwise (NO in step S60), the control unit 101 returns control to step S10.

In the above description, the example in which the luminance of the light emitting panel 2 is changed by the touch detection and the proximity detection has been described, but other than the luminance of the light emitting panel 2 may be changed. For example, in the illumination device 100, the light emission intervals (that is, blinking mode) of the light emission panel 2 of touch detection and proximity detection may be made different, or the light emission colors of the illumination device 100 of touch detection and proximity detection may be made different.

[Device Equipped with Illumination Device 100]

Figure 7:
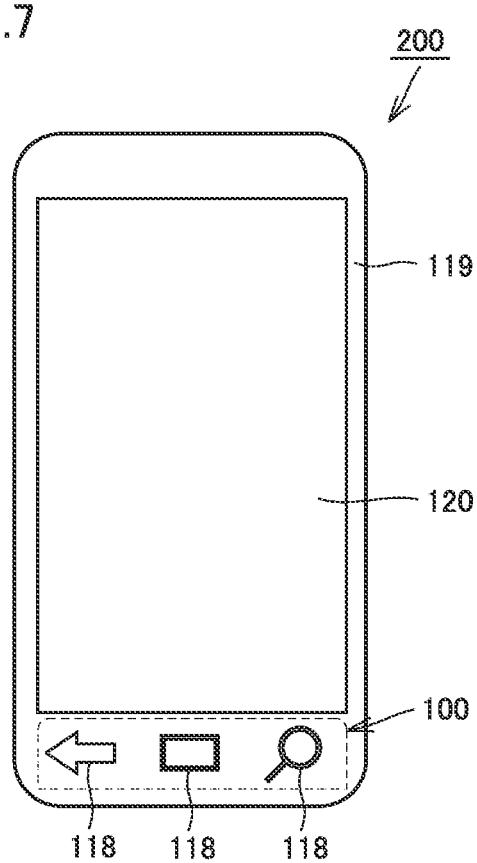
FIG. 7 is a diagram showing an information processing apparatus mounted with an illumination device according to a first embodiment.

With reference to FIG. 7, an example of a device mounting the illumination device 100 will be described. FIG. 7 is a diagram showing the information processing apparatus 200 on which the illumination device 100 is mounted.

FIG. 7 shows an information processing apparatus 200 as a smartphone. The information processing apparatus 200 includes the above-described illumination device 100, operation buttons 118, a housing 119, and a liquid crystal display 120.

The anode 12 for touch detection and the cathode 14 for proximity detection of the illumination device 100 are disposed to face the housing 119 of the information processing apparatus 200. That is, the planar anode 12 and the cathode 14 are disposed in parallel with the housing surface of the information processing apparatus 200. The anode 12 for touch detection is disposed closer to the housing 119 than the cathode 14. That is, the distance between the touch detection anode 12 and the housing 119 is shorter than the distance between the proximity detection cathode 14 and the housing 119. In the example of FIG. 7, the anode 12 is disposed on the near side of the page and the cathode 14 is disposed on the far side of the page. Since the anode 12 for touch detection is provided on the side of the housing 119, reduction in sensitivity in touch detection is suppressed.

For example, the illumination device 100 functions as a backlight of the operation button 118. When the user approaches the information processing apparatus 200, the illumination device 100 lights up with a predetermined luminance, and the user can visually recognize the operation button 118. When the user touches the information processing apparatus 200, the illumination device 100 lights up more brightly and the user can recognize that the operation button 118 has been touched.

In the above description, the example in which the illumination device 100 is applied to the information processing apparatus 200 as a smartphone has been described, but the illumination device 100 may be applied to other devices having a lighting function. For example, the illumination device 100 can also be applied to household lighting, car interior lighting, backlight of the liquid crystal display 120, and the like. In addition, the illumination device 100 may be used as a back light of a clock and the like, a signboard advertisement, a signal light, a light source such as an optical storage medium, a light source of an electrophotographic copying machine, a light source of an optical communication processor, a light source of a light sensor, electric appliances and the like.

Summary of First Embodiment

As described above, the illumination device 100 according to the present embodiment includes the planar anode 12, the planar cathode 14 disposed to face the anode 12, and the emitting layer 13 disposed between the anode 12 and the cathode 14. A detection circuit 40 for touch detection is electrically connected to the anode 12. A detection circuit 50 for proximity detection is electrically connected to the cathode 14. Thereby, the illumination device 100 can detect not only the touch operation but also the proximity of the user. In addition, since the anode 12 is shared for light emission and touch detection and the cathode 14 is shared for light emission and proximity detection, it is not necessary to newly provide electrodes for touch detection and proximity detection. Thereby, the configuration of the illumination device 100 is simplified, and the thinning of the illumination device 100 is realized.

Second Embodiment

[Overview]

The illumination device 100 according to the first embodiment is composed of one anode 12, one light emitting layer 13, and one cathode 14. In contrast, the illumination device 100A according to the second embodiment includes a plurality of anodes 12, a plurality of light-emitting layers 13, and a single cathode 14.

The other points of the illumination device 100A according to the second embodiment are the same as the illumination device 100 according to the first embodiment, so that the description thereof will not be repeated below.

[Illumination Device 100A]

Figure 8:
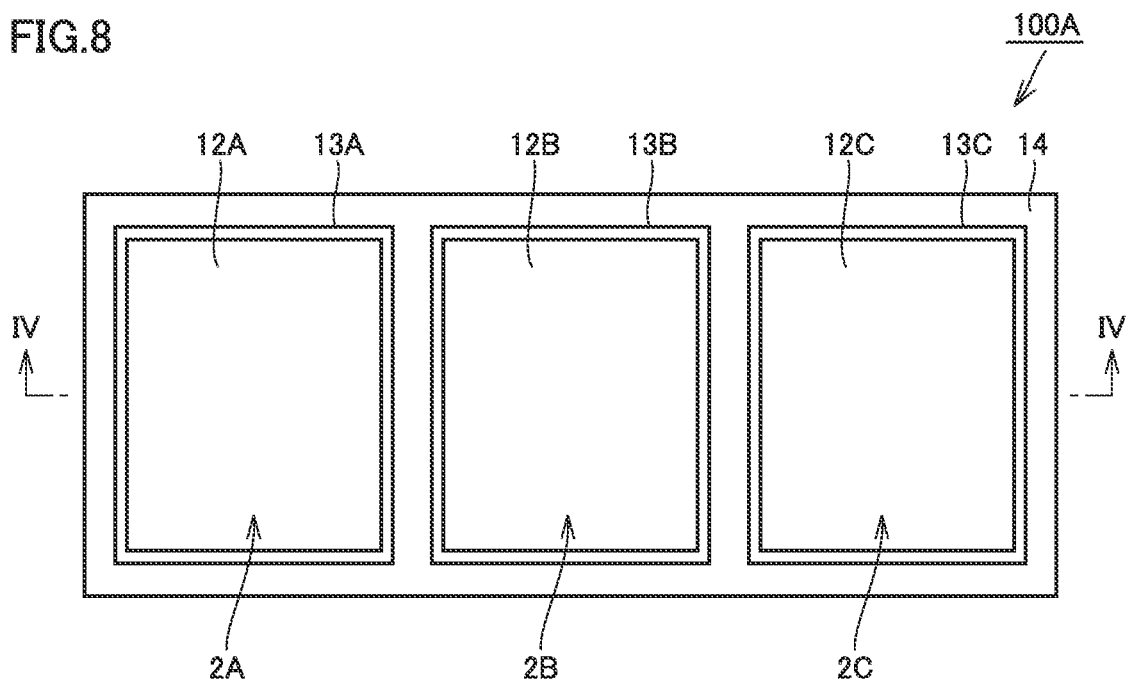
FIG. 8 is a plan view showing an illumination device according to a second embodiment.
Figure 9:
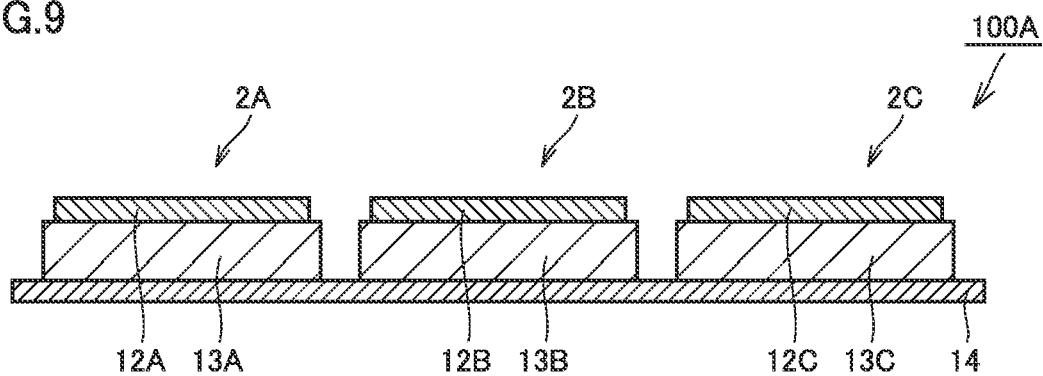
FIG. 9 is a cross-sectional view taken along line IV-IV in FIG. 8.

With reference to FIGS. 8 and 9, the illumination device 100A according to the second embodiment will be described. FIG. 8 is a plan view showing the illumination device 100A. FIG. 9 is a cross-sectional view taken along the line IV-IV in FIG. 8. For ease of understanding, in FIGS. 8 and 9, the metal layer 11, the sealing member 15, the insulating layer 16, and the transmitting member 19 shown in FIG. 2 are omitted.

the illumination device 100A includes light emitting panels 2A to 2C. The light emitting panel 2A is configured by a planar anode 12A, a light emitting layer 13A, and a planar cathode 14. The light emitting panel 2B is configured by a planar anode 12B, a light emitting layer 13B, and a planar cathode 14. The light emitting panel 2C is configured by a planar anode 12C, a light emitting layer 13C, and a planar cathode 14. As described above, the light emitting panels 2A to 2C share the cathode 14.

In FIGS. 8 and 9, although an example in which the illumination device 100A is configured with three anodes is shown, the illumination device 100A may be configured with two anodes or may be configured with four or more anodes. Similarly, although the example in which the illumination device 100A is configured with three light emitting layers is shown, the illumination device 100A may be configured with two light emitting layers, or may be configured with four or more light emitting layers.

[Touch Detection Function and Proximity Detection Function]

Figure 10:
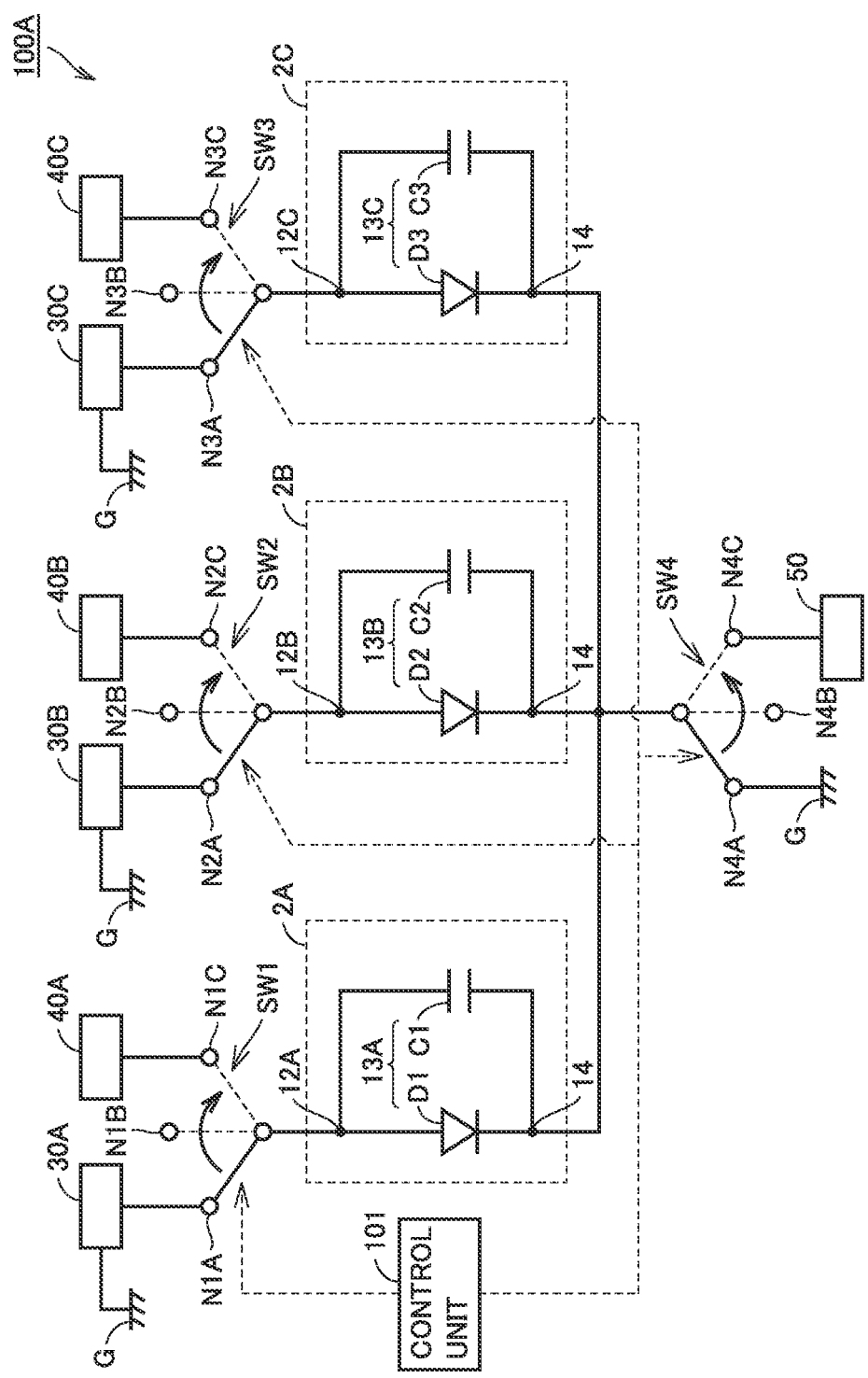
FIG. 10 is a diagram showing an example of a circuit configuration of an illumination device according to a second embodiment.
Figure 11:
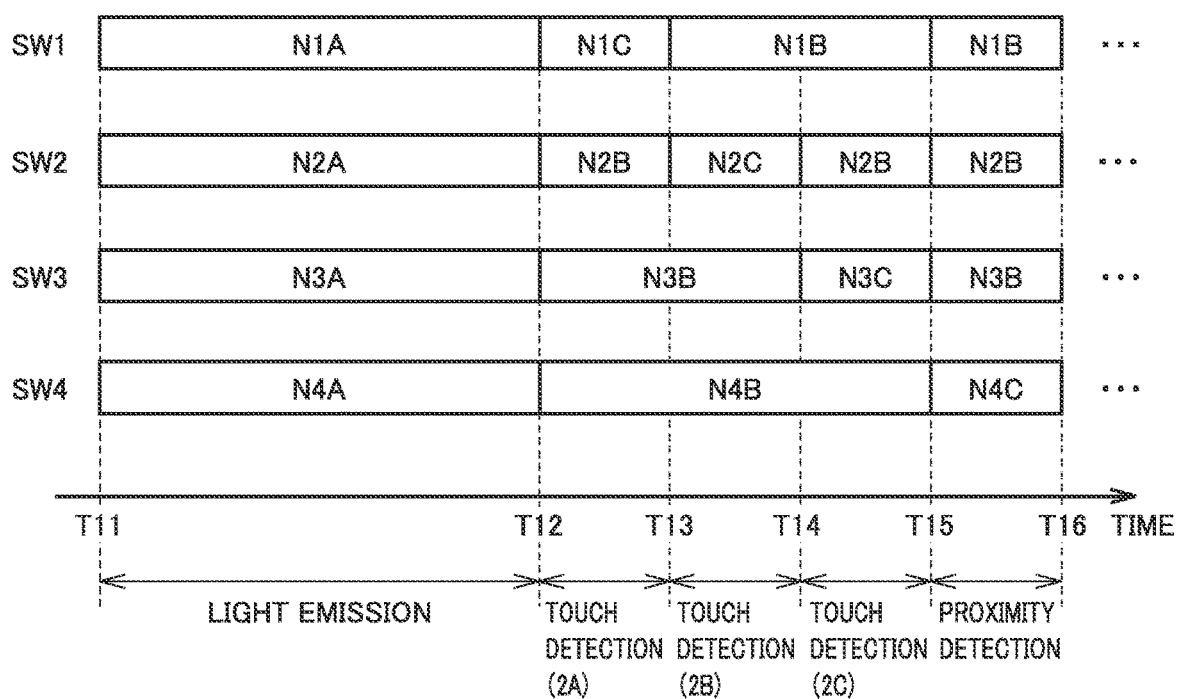
FIG. 11 is a diagram showing an example of a control sequence of an illumination device according to a second embodiment.

With reference to FIG. 10 and FIG. 11, the touch detection function and the proximity detection function in the illumination device 100A will be described. FIG. 10 is a diagram showing an example of the circuit configuration of the illumination device 100A.

As shown in FIG. 10, the illumination device 100A includes light emitting panels 2A to 2C, power sources 30A to 30C, detection circuits 40A to 40C for touch detection, and a detection circuit 50 for proximity detection.

FIG. 10 shows an equivalent circuit of the light emitting panels 2A to 2C shown in FIGS. 8 and 9. In the light emitting panel 2A as an equivalent circuit, the anode 12A and the cathode 14 are represented by terminals (black dots in FIG. 10), respectively, and the light emitting layer 13A is represented by a parallel circuit of a light emitting diode D1 and a capacitor C1. In the light emitting panel 2B as an equivalent circuit, the anode 12B and the cathode 14 are represented by terminals (black dots in FIG. 10), respectively, and the light emitting layer 13B is represented by a parallel circuit of a light emitting diode D2 and a capacitor C2. In the light emitting panel 2C as an equivalent circuit, the anode 12C and the cathode 14 are represented by terminals (black dots in FIG. 10), respectively, and the light emitting layer 13C is represented by a parallel circuit of a light emitting diode D3 and a capacitor C3.

The power sources 30A to 30C are constant current sources. The power source 30A is electrically connected to the ground G and the contact N1A and supplies a current to the light emitting layer 13A disposed between the anode 12A and the cathode 14. The power source 30B is electrically connected to the ground G and the contact N2A and supplies a current to the light emitting layer 13B disposed between the anode 12B and the cathode 14. The power source 30C is electrically connected to the ground G and the contact N3A and supplies a current to the light emitting layer 13C arranged between the anode 12C and the cathode 14.

The detection circuits 40A to 40C are electrostatic capacitance type touch sensors that detect a touch operation based on a change in electrostatic capacitance of the illumination device 100A. The detection circuit 40A is electrically connected to the contact N1C, and detects a change in the electrostatic capacitance of the illumination device 100A caused by a touch operation on the light emitting panel 2A. The detection circuit 40B is electrically connected to the contact N2C, and detects a change in the electrostatic capacitance of the illumination device 100A caused by a touch operation on the light emitting panel 2B. The detection circuit 40C is electrically connected to the contact N3C, and detects a change in the electrostatic capacitance of the illumination device 100A caused by a touch operation on the light emitting panel 2C.

The detection circuit 50 is an electrostatic capacitance type touch sensor that detects the proximity of the user to the illumination device 100A based on the change in the electrostatic capacitance of the illumination device 100A. The detection circuit 50 is electrically connected to the contact N4C and detects a change in the electrostatic capacitance caused by the proximity of the user to the illumination device 100A.

More specifically, the detection circuit 50 for proximity detection detects proximity of the user based on the fact that the amount of change in electrostatic capacitance of the illumination device 100A exceeds the first threshold value.

On the other hand, the touch detection circuits 40A to 40C detect the touch operation by the user based on the fact that the change amount of the electrostatic capacitance of the illumination device 100A exceeds the second threshold value (>the first threshold value). As described above, the detection circuits 40A to 40C can detect the touch operation by the detection circuits 40A to 40C, 50 detecting the change in the electrostatic capacitance with different sensitivities, and the detection circuit 50 detects the proximity of the user's finger by the detection circuits 40A to 40C, 50 detecting the change in the electrostatic capacitance with different sensitivities. In the present embodiment, since a plurality of detection circuits are provided for touch detection, the illumination device 100A can specify the touch position based on which one of the light emitting panels 2A to 2C the user has touched.

A switch SW1 is electrically connected to the anode 12A. The switch SW1 can switch at least one of a state of electrically connecting the anode 12A to the power source 30A, a state of electrically connecting the anode 12A to the contact N1B of the predetermined electric potential, and state of electrically connecting the anode 12A to the detection circuit 40A. The switch SW1 is controlled by the control unit 101.

A switch SW2 is electrically connected to the anode 12B. The switch SW2 can switch at least one of a state of electrically connecting the anode 12B to the power source 30B, a state of electrically connecting the anode 12B to the contact N2B of the predetermined electric potential, and a state of electrically connecting the anode 12B to the detecting circuit 40B. The switch SW2 is controlled by the control unit 101.

A switch SW3 is electrically connected to the anode 12C. The switch SW3 can switch at least one of a state of electrically connecting the anode 12C to the power source 30C, a state of electrically connecting the anode 12C to the contact N3B of the predetermined electric potential, and a state of electrically connecting the anode 12C to the detection circuit 40C. The switch SW3 is controlled by the control unit 101.

A switch SW4 is electrically connected to the cathode 14. The switch SW4 can switch at least one of a state of electrically connecting the cathode 14 to the ground G, a state of electrically connecting the cathode 14 to the contact N4B of a predetermined electric potential, and a state of electrically connecting the cathode 14 to the detection circuit 50. The switch SW4 is controlled by the control unit 101.

FIG. 11 is a diagram showing an example of a control sequence of the illumination device 100A according to the second embodiment.

It is assumed that the light emission period arrives at time T11. In the light emission period, the control unit 101 connects the switch SW1 to the contact N1A, connects the switch SW2 to the contact N2A, connects the switch SW3 to the contact N3A, and connects the switch SW4 to the contact N4A. As a result, a current flow flows from the power source 30A→the anode 12A→the light emitting diode D1→the cathode 14→the ground G, and the light emitting panel 2A emits light. At the same time, a current flow flows from the power source 30B→the anode 12B→the light emitting diode D2→the cathode 14→the ground G, and the light emitting panel 2B emits light. At the same time, a current flow flows from the power source 30C→the anode 12C→the light emitting diode D3→the cathode 14→the ground G, and the light emitting panel 2C emits light.

It is assumed that the touch sensing period for the light emitting panel 2A has arrived at time T12. In the touch sensing period, the control unit 101 electrically connects the anode 12A to the detection circuit 40A by connecting the switch SW1 to the contact N1C. At the same time, the control unit 101 brings the anode 12B to the floating state by connecting the switch SW2 to the contact N2B. At the same time, the control unit 101 brings the anode 12C into a floating state by connecting the switch SW3 to the contact N3B. At the same time, the control unit 101 bringing the cathode 14 into a floating state by connecting the switch SW4 to the contact N4B. At this time, when the finger of the user approaches the light emitting panel 2A, an electrostatic capacitance is generated between the finger and the light emitting panel 2A, and the electrostatic capacitance of the illumination device 100A changes. The detection circuit 40A detects a touch operation on the light emitting panel 2A based on the fact that the electrostatic capacitance of the illumination device 100A changes by a predetermined amount or more.

It is assumed that a touch sensing period for the light emitting panel 2B arrives at time T13. In the touch sensing period, the control unit 101 brings the anode 12A into a floating state by connecting the switch SW1 to the contact N1B. At the same time, the control unit 101 electrically connects the anode 12B to the detection circuit 40B by connecting the switch SW2 to the contact N2C. At the same time, the control unit 101 brings the anode 12C into a floating state by connecting the switch SW3 to the contact N3B. At the same time, the control unit 101 brings the cathode 14 into a floating state by connecting the switch SW4 to the contact N4B. At this time, when the user's finger approaches the light emitting panel 2B, an electrostatic capacitance is generated between the finger and the light emitting panel 2B, and the electrostatic capacitance of the lamination device 100A changes. The detection circuit 40B detects a touch operation on the light emitting panel 2B based on the fact that the electrostatic capacitance of the lamination device 100A changes by a predetermined amount or more.

It is assumed that the touch sensing period for the light emitting panel 2C arrives at time T14. In the touch sensing period, the control unit 101 brings the anode 12A into a floating state by connecting the switch SW1 to the contact N1B. At the same time, the control unit 101 brings the anode 12B into a floating state by connecting the switch SW2 to the contact N2B. At the same time, the control unit 101 electrically connects the anode 12C to the detection circuit 40C by connecting the switch SW3 to the contact N3C. At the same time, the control unit 101 bringing the cathode 14 into a floating state by connecting the switch SW4 to the contact N4B. At this time, when the user's finger approaches the light emitting panel 2C, an electrostatic capacitance is generated between the finger and the light emitting panel 2C, and the electrostatic capacitance of the illumination device 100A changes. The detection circuit 40C detects a touch operation on the light emitting panel 2C based on the fact that the electrostatic capacitance of the illumination device 100A changes by a predetermined amount or more.

It is assumed that the proximity sensing period arrives at time T15. In the proximity sensing period, the control unit 101 brings the anode 12A into a floating state by connecting the switch SW1 to the contact N1B. At the same time, the control unit 101 brings the anode 12B into a floating state by connecting the switch SW2 to the contact N2B. At the same time, the control unit 101 brings the anode 12C into a floating state by connecting the switch SW3 to the contact N3B. At the same time, the control unit 101 electrically connects the cathode 14 to the detection circuit 50 by connecting the switch SW4 to the contact N4C. At this time, when the finger of the user approaches the illumination device 100A, an electrostatic capacitance is generated between the finger and the illumination device 100A, and the electrostatic capacitance of the illumination device 100A changes. The detection circuit 50 detects the proximity of the user to the illumination device 100A based on the fact that the electrostatic capacitance of the illumination device 100A changes by a predetermined amount or more.

At time T16, the light emission period again comes. After time T16, the control unit 101 sequentially executes the light emission process, the touch detection process, and the proximity detection process. In this manner, the control unit 101 repeatedly executes the light emission process, the touch detection process, and the proximity detection process.

[Modification]

Figure 12:
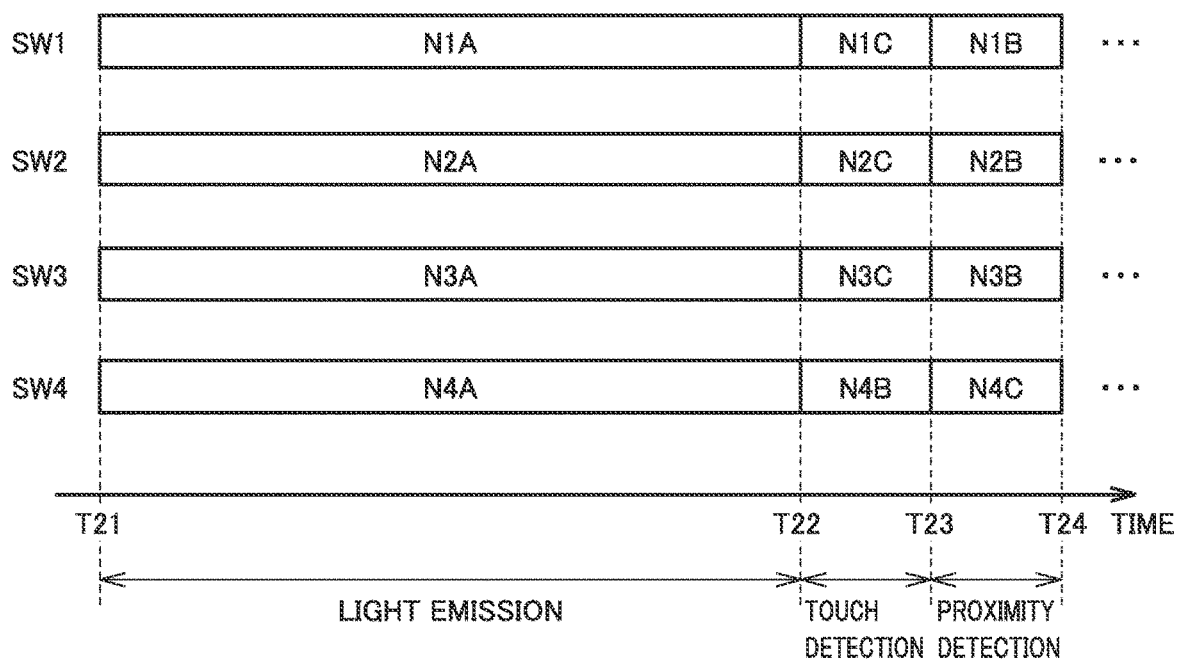
FIG. 12 is a diagram showing a modified example of a control sequence in an illumination device according to the second embodiment.

FIG. 12 is a diagram showing a modification of the control sequence in the illumination device 100A according to the second embodiment. In the above described control sequence shown in FIG. 11, the touch detection on the light emitting panels 2A to 2C is executed in a time-sharing manner. On the other hand, in the control sequence shown in FIG. 12, the touch detection on the light emitting panels 2A to 2C is simultaneously executed.

It is assumed that the light emission period has arrived at time T21. During the light emission period, the control unit 101 connects the switch SW1 to the contact N1A, connects the switch SW2 to the contact N2A, connects the switch SW3 to the contact N3A, and connects the switch SW4 to the contact N4A. As a result, a current flow flows front the power source 30A→the anode 12A→the light emitting diode D1→the cathode 14→and the ground G, and the light emitting panel 2A emits light. At the same time, a current flow flows from the power source 30B→the anode 12B→the light emitting diode D2→the cathode 14→and the ground G, and the light emitting panel 2B emits light. At the same time, a current flow flows from the power source 30C→the anode 12C→the light emitting diode D3→the cathode 14→the ground G, and the light emitting panel 2C emits light.

It is assumed that a touch sensing period for the light emitting panel 2A has arrived at time T22. In the touch sensing period, the control unit 101 electrically connects the anode 12A to the detection circuit 40A by connecting the switch SW1 to the contact N1C. At the same time, the control unit 101 electrically connects the anode 12B to the detection circuit 40B by connecting the switch SW2 to the contact N2C. The control unit 101 electrically connects the anode 12C to the detection circuit 40C by connecting the switch SW3 to the contact N3C. At the same time, the control unit 101 brings the cathode 14 into a floating state by connecting the switch SW4 to the contact N4B.

At this time, when the user's finger touches any one of the light emitting panels 2A to 2C, an electrostatic capacitance is generated between the illumination device 100A and the finger, and the electrostatic capacitance of the illumination device 100A changes. The detection circuit 40A detects a touch operation on the light emitting panel 2A based on the fact that the electrostatic capacitance of the illumination device 100A changes by a predetermined amount or more. The detection circuit 40B detects a touch operation on the light emitting panel 2B based on the fact that the electrostatic capacitance of the illumination device 100A changes by a predetermined amount or more. The detection circuit 40C detects a touch operation on the light emitting panel 2C based on the fact that the electrostatic capacitance of the illumination device 100A changes by a predetermined amount or more.

It is assumed that the proximity sensing period has arrived at time T23. In the proximity sensing period, the control unit 101 brings the anode 12A into a floating state by connecting the switch SW1 to the contact N1B. At the same time, the control unit 101 bring the anode 12B into a floating state by connecting the switch SW2 to the contact N2B. At the same time, the control unit 101 bringing the anode 12C into a floating state by connecting the switch SW3 to the contact N3B. At the same time, the control unit 101 electrically connects the cathode 14 to the detection circuit 50 by connecting the switch SW4 to the contact N4C. At this time, when the finger of the user approaches the illumination device 100A, an electrostatic capacitance is generated between the finger and the illumination device 100A, and the electrostatic capacitance of the illumination device 100A changes. The detection circuit 50 detects the proximity of the user to the illumination device 100A based on the fact that the electrostatic capacitance of the illumination device 100A changes by a predetermined amount or more.

At the time T24, the light emission period again comes. After time T24, the control unit 101 sequentially executes light emission processing, touch detection processing, and proximity detection processing. In this manner, the control unit 101 repeatedly executes the light emission process, the touch detection process, and the proximity detection process.

Summary of Second Embodiment

As described above, the illumination device 100A according to the present embodiment includes a plurality of anodes and a plurality of detection circuits for touch detection. Each of the plurality of detection circuits for touch detection is electrically connected to each of the plurality of anodes. Thereby, the illumination device 100A can detect which position of the illumination device 100A the user has touched, and can change the lighting mode according to the touch position.

Third Embodiment

[Overview]

The illumination device 100A according to the second embodiment does not set the anode 12 and the cathode 14 at the same potential during the touch sensing period and the proximity sensing period. On the other hand, the illumination device 100B according to the third embodiment sets the anode 12 and the cathode 14 at the same potential during the touch sensing period and the proximity sensing period. By changing the anode 12 and the cathode 14 to the same potential, the electrostatic capacitance of the light emitting panel 2 does not change. As a result, the illumination device 100B becomes easy to detect the electrostatic capacitance generated between the illumination device 100B and the user's finger, and the touch operation and proximity can be more reliably detected.

Other points of the illumination device 100B according to the third embodiment are the same as the illumination device 100A according to the second embodiment, so that the description thereof will not be repeated below.

[Touch Detection Function and Proximity Detection Function]

Figure 13:
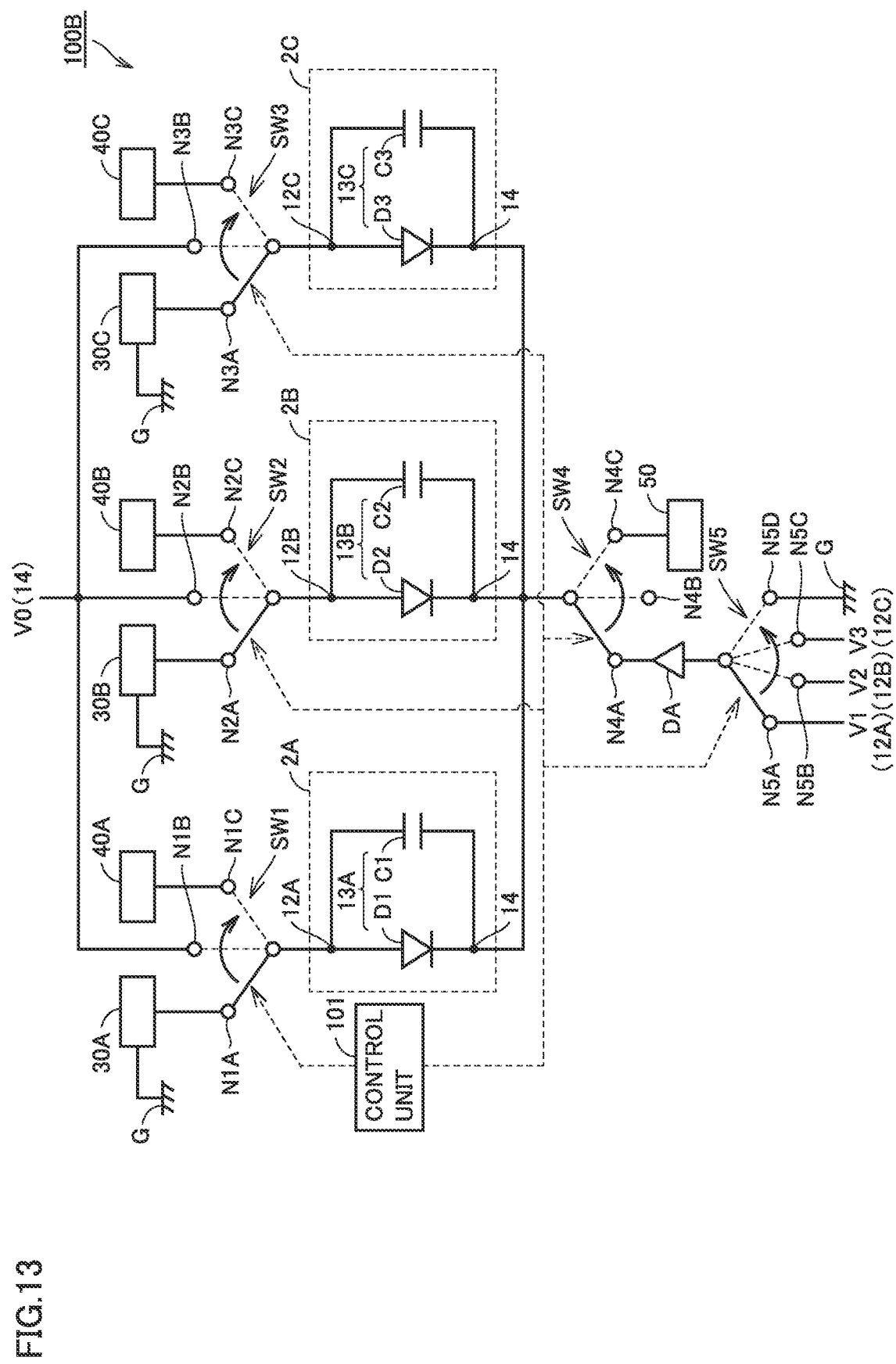
FIG. 13 is a diagram showing an example of a circuit configuration of an illumination device according to a third embodiment.
Figure 14:
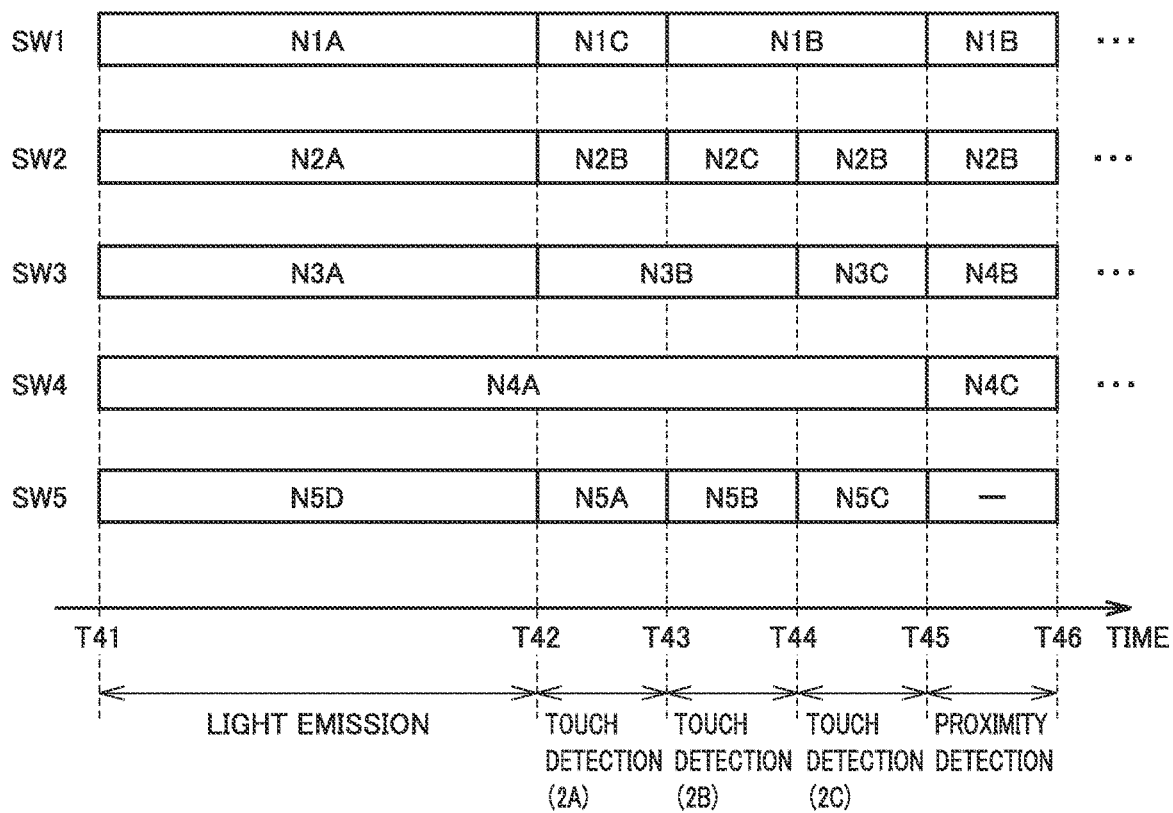
FIG. 14 is a diagram showing an example of a control sequence of an illumination device according to a third embodiment.

With reference to FIG. 13 and FIG. 14, the touch detection function and the proximity detection function in the illumination device 100B will be described. FIG. 13 is a diagram showing an example of the circuit configuration of the illumination device 100B.

In the third embodiment, the contacts N1B to N3B are set to the terminal of potential V0.

The terminal is connected to the cathode 14. Therefore, the potential V0 is equal to the potential at the cathode 14.

The contact N4A of the switch SW4 is connected with an analog buffer DA (diode) and a switch SW5 in series. The switch SW5 can switch a state of connecting the contact N4A to the contact N5A of the potential V1, a state of connecting the contact N4A to the contact N5B of the potential V2, a state of connecting the contact N4A to the contact N5C of the potential V3, and a state of connecting the contact N4A to ground G.

The contact N5A is connected to the anode 12A. Therefore, the potential V1 is equal to the potential at the anode 12A. The contact N5B is connected to the anode 12B. Therefore, the potential V2 is equal to the potential at the anode 12B. The contact N5C is connected to the anode 12C. Therefore, the potential V3 is equal to the potential at the anode 12C.

FIG. 14 is a diagram showing an example of a control sequence of the illumination device 100B according to the third embodiment.

It is assumed that the light emission period arrives at time T41. During the light emission period, the control unit 101 connects the switch SW1 to the contact N1A, connects the switch SW2 to the contact N2A, connects the switch SW3 to the contact N3A, connects the switch SW4 to the contact N4A, connects the switch SW5 to the contact N5D. As a result, the light emitting panels 2A to 2C emit light.

It is assumed that the touch sensing period for the light emitting panel 2A arrives at time T42. In the touch sensing period, the control unit 101 electrically connects the anode 12A to the detection circuit 40A by connecting the switch SW1 to the contact N1C. At the same time, the control unit 101 brings the anode 12B into the floating state by connects the switch SW2 to the contact N2B. At the same time, the control unit 101 brings the anode 12C into a floating state by connecting the switch SW3 to the contact N3B. At the same time, the control unit 101 set the potential of the cathode 14 to "V1" via the analog buffer DA by connecting the switch SW4 to the contact N4A and connects the switch SW5 to the contact N5A. As a result, the potential of the cathode 14 becomes equal to the potential of the anode 12A via the analog buffer DA. Thus, the capacitance of the light emitting panel 2A does not change, and the detection circuit 40A can easily detect the electrostatic capacitance generated between the user's finger and the illumination device 100B. As a result, the accuracy of touch detection on the light emitting panel 2A is improved.

It is assumed that a touch sensing period for the light emitting panel 2B arrives at time T43. In the touch sensing period, the control unit 101 brings the anode 12A into a floating state by connecting the switch SW1 to the contact N1B. At the same time, the control unit 101 electrically connects the anode 12B to the detection circuit 40B by connecting the switch SW2 to the contact N2C. At the same time, the control unit 101 brings the anode 12C into a floating state by connects the switch SW3 to the contact N3B. At the same time, the control unit 101 sets the potential of the cathode 14 to "V2" via the analog buffer DA by connecting the switch SW4 to the contact N4A and connects the switch SW5 to the contact N5B. As a result, the potential of the cathode 14 becomes equal to the potential of the anode 12B via the analog buffer DA. As a result, the capacitance of the light emitting panel 2B does not change, and the detection circuit 40B can easily detect the electrostatic capacitance generated between the user's finger and the illumination device 100B. As a result, the accuracy of the touch detection on the light emitting panel 2B is improved.

It is assumed that a touch sensing period for the light emitting panel 2C arrives at time T44. In the touch sensing period, the control unit 101 brings the anode 12A into a floating state by connecting the switch SW1 to the contact N1B. At the same time, the control unit 101 brings the anode 12B into a floating state by connecting the switch SW2 to the contact N2B. At the same time, the control unit 101 electrically connects the anode 12C to the detection circuit 40C by connecting the switch SW3 to the contact N3C. At the same time, the control unit 101 sets the potential of the cathode 14 to "V3" via the analog buffer DA by connecting the switch SW4 to the contact N4A and connects the switch SW5 to the contact N5C. As a result, the potential of the cathode 14 becomes equal to the potential of the anode 12C via the analog buffer DA. Thereby, the capacitance of the light emitting panel 2C does not change, and the detection circuit 40C can easily detect the electrostatic capacitance generated between the user's finger and the illumination device 100B. As a result, the accuracy of the touch detection on the light emitting panel 2C is improved.

It is assumed that the proximity sensing period arrives at time T45. In the proximity sensing period, the control unit 101 sets the potential of the anode 12A to "V0" by connecting the switch SW1 to the contact N1B. At the same time, the control unit 101 sets the potential of the anode 12B to "V0" connecting the switch SW2 to the contact N2B. At the same time, the control unit 101 sets the potential of the anode 12C to "V0" connecting the switch SW3 to the contact N3C. At the same time, the control unit 101 electrically connects the cathode 14 to the detection circuit 50 by connecting the switch SW4 to the contact N4C. As a result, the electrostatic capacitance of the light emitting panels 2A to 2C does not change, and the detection circuit 50C can easily detect the electrostatic capacitance generated between the user's finger and the lighting device 100B. As a result, the accuracy of the proximity detection of the user with respect to the lighting device 100B is improved.

At time T46, the light emission period again comes. After time T46, the control unit 101 sequentially executes light emission processing, touch detection processing, and proximity detection processing. In this manner, the control unit 101 repeatedly executes the light emission process, the touch detection process, and the proximity detection process.

[Modification]

Figure 15:
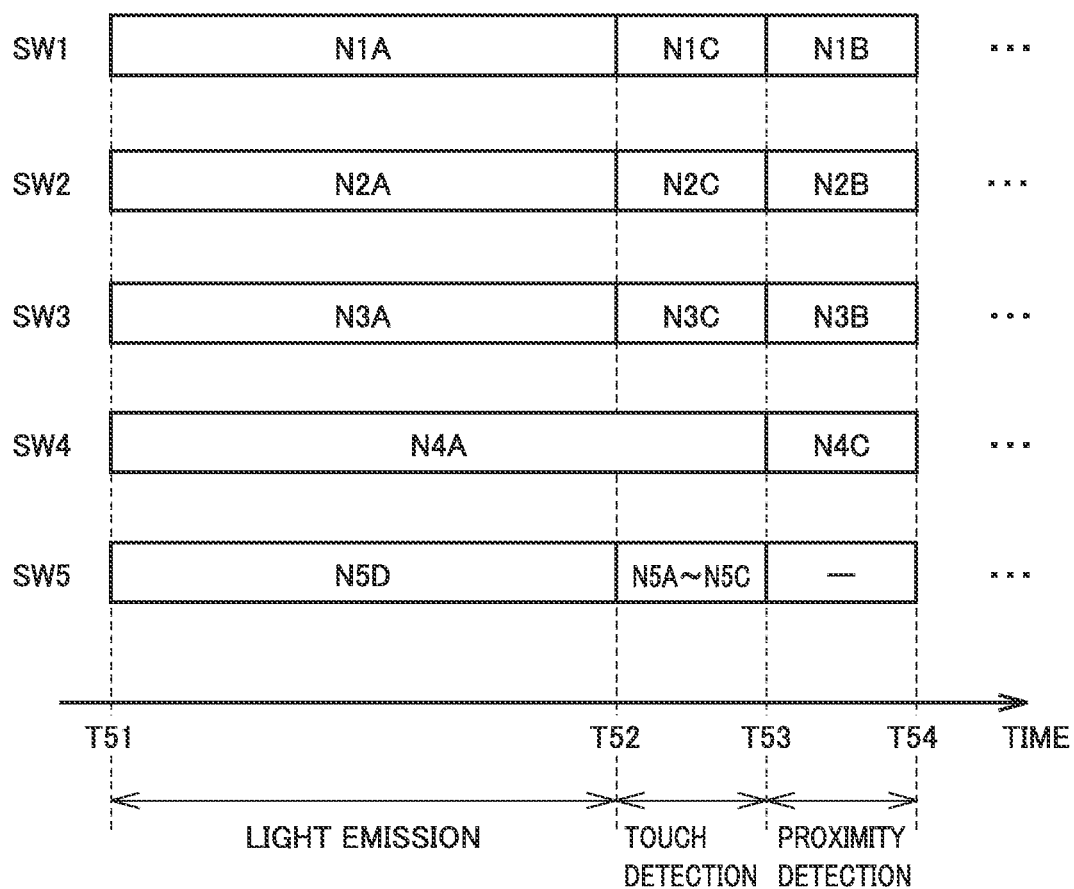
FIG. 15 is a diagram showing a modified example of a control sequence in an illumination device according to the third embodiment.

FIG. 15 is a diagram showing a modified example of the control sequence in the illumination device 100B according to the third embodiment In the above-described control sequence shown in FIG. 14, the touch detection on the light emitting panels 2A to 2C is executed in a time-sharing manner. On the other hand, in the control sequence shown in FIG. 15, the touch detection on the light emitting panels 2A to 2C is simultaneously executed.

It is assumed that the light emission period has arrived at time T51. During the light emission period, the control unit 101 connects the switch SW1 to the contact N1A, connects the switch SW2 to the contact N2A, connects the switch SW3 to the contact N3A, connects the switch SW4 to the contact N4A, connects the switch SW to the contact N5D. As a result, the light emitting panels 2A to 2C emit light.

It is assumed that a touch sensing period for the light emitting panel 2A has arrived at time T52. In the touch sensing period, the control unit 101 electrically connects the anode 12A to the detection circuit 40A by connecting the switch SW1 to the contact N1C. At the same time, the control unit 101 electrically connects the anode 12B to the detection circuit 40B by connecting the switch SW2 to the contact N2C. The control unit 101 electrically connects the anode 12C to the detection circuit 40C by connecting the switch SW3 to the contact N3C. At the same time, the control unit 101 connects the switch SW4 to the contact N4A and connects the switch SW5 to one of the contacts N5A to N5C. Preferably, the cathode 14 is brought to the same potential as the anodes 12A to 12C via the analog buffer DA.

At this time, when the user's finger touches any one of the light-emitting panels 2A to 2C, an electrostatic capacitance is generated between the illumination device 100B and the finger, and the electrostatic capacitance of the illumination device 100B changes. The detection circuit 40A detects a touch operation on the light emitting panel 2A based on the fact that the electrostatic capacitance of the illumination device 100B has changed by a predetermined amount or more. The detection circuit 40B detects a touch operation on the light emitting panel 2B based on the fact that the electrostatic capacitance of the illumination device 100B changes by a predetermined amount or more. The detection circuit 40C detects a touch operation on the light emitting panel 2C on the basis that the electrostatic capacitance of the illumination device 100B changes by a predetermined amount or more.

At time T54, the light emission period again comes. After time T54, the control unit 101 sequentially executes light emission processing, touch detection processing, and proximity detection processing. In this manner, the control unit 101 repeatedly executes the light emission process, the touch detection process, and the proximity detection process.

Summary of Third Embodiment

As described above, the illumination device 100B sets the anode 12 and the cathode 14 at the same potential during the sensing period of the touch operation. As a result, the electrostatic capacitance of the light emitting panels 2A to 2C does not change, and the touch detection circuits 40A to 40C can easily detect the electrostatic capacitance generated between the finger of the user and the illumination device 100C. As a result, the accuracy of touch detection is improved.

Further, the illumination device 100B sets the anode 12 and the cathode 14 at the same potential in the proximity sensing period. Thereby, the electrostatic capacitance of the light emitting panels 2A to 2C does not change, and the detection circuit 50 for proximity detection makes it easy to detect the electrostatic capacitance generated between the user's finger and the illumination device 100C. As a result, accuracy of proximity detection is improved.

Fourth Embodiment

[Overview]

The illumination device 100 according to the second embodiment is composed of a plurality of anodes 12, a plurality of light-emitting layers 13, and a single cathode 14. In contrast, the illumination device 100C according to the fourth embodiment includes a plurality of anodes 12, one light-emitting layer 13, and one cathode 14.

The other points of the illumination device 100C according to the fourth embodiment are the same as the illumination device 100A according to the second embodiment, so that the description thereof will not be repeated below.

[Illumination Device 100C]

Figure 16:
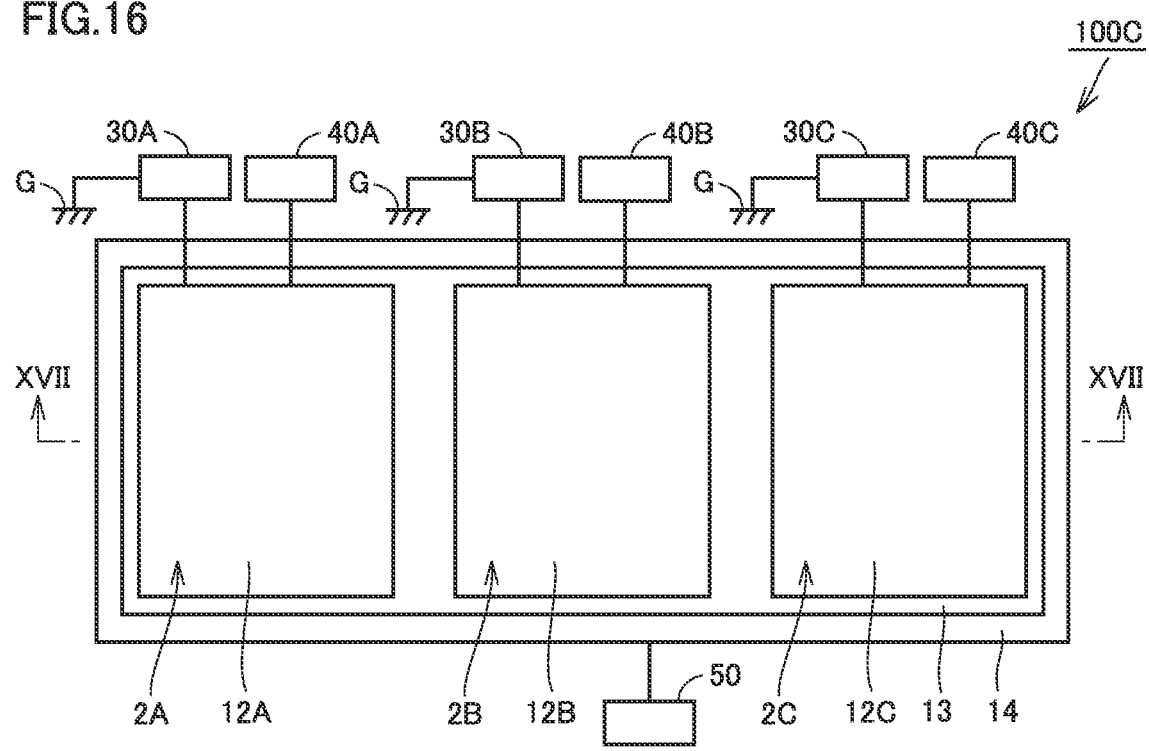
FIG. 16 is a plan view showing an illumination device according to a fourth embodiment.
Figure 17:
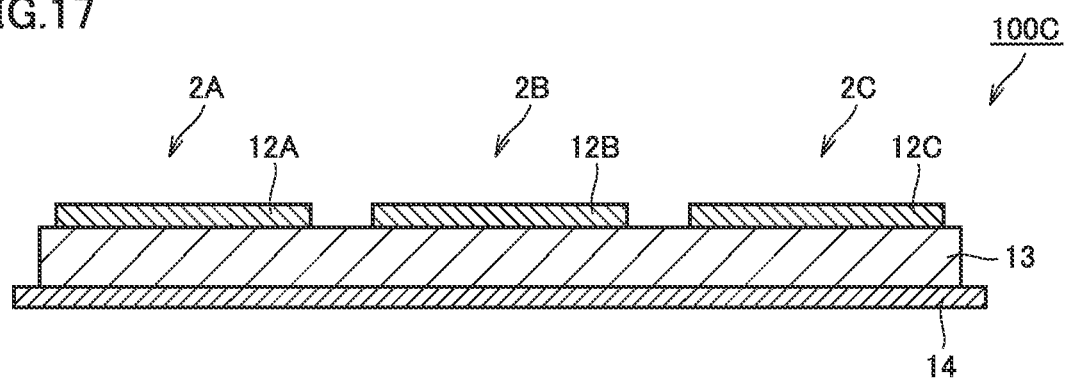
FIG. 17 is a cross-sectional view taken along the line XVII-XVII in FIG. 16.

With reference to FIGS. 16 and 17, a description will be given of a illumination device 100C according to a fourth embodiment. FIG. 16 is a plan view showing the illumination device 100C. FIG. 17 is a cross-sectional view taken along line XVII-XVII in FIG. 16. For ease of understanding, in FIGS. 16 and 17, the metal layer 11, the sealing member 15, the insulating layer 16, and the transmitting member 19 shown in FIG. 2 are omitted.

The illumination device 100C includes light emitting panels 2A to 2C. The light emitting panel 2A is configured of a planar anode 12A, a light emitting layer 13, and a planar cathode 14. The light emitting panel 2B is configured by a planar anode 12B, a light emitting layer 13, and a planar cathode 14. The light emitting panel 2C is configured by a planar anode 12C, a light emitting layer 13, and a planar cathode 14. The light emitting panels 2A to 2C share the light emitting layer 13 and the cathode 14.

The power supplies 30A to 30C are constant current sources. The power source 30A is connected to the anode 12A and the ground G, and supplies a current to the light emitting layer 13 disposed between the anode 12A and the cathode 14. The power source 30B is connected to the anode 12B and the ground G. and supplies a current to the light emitting layer 13 disposed between the anode 12B and the cathode 14. The power source 30C is connected to the anode 12C and the ground G, and supplies a current to the light emitting layer 13 disposed between the anode 12C and the cathode 14.

The detection circuits 40A to 40C are sensors for detecting the touch operation by the user. The detection circuit 40A is electrically connected to the anode 12A, and detects a change in electrostatic capacitance of the illumination device 100C caused by a touch operation. The detection circuit 40B is electrically connected to the anode 12B, and detects a change in the electrostatic capacitance of the illumination device 100C caused by a touch operation. The detection circuit 40C is electrically connected to the anode 12C, and detects a change in the electrostatic capacitance of the illumination device 100C caused by a touch operation.

The detection circuit 50 is a sensor for detecting proximity of the user. The detection circuit 50 is electrically connected to the cathode 14, and detects a change in the electrostatic capacitance of the illumination device 100C due to the proximity of the user.

In FIGS. 16 and 17, although the example in which the illumination device 100C is composed of three anodes is shown, the illumination device 100C may be constituted by two anodes or four or more anodes.

Summary of Fourth Embodiment

As described above, in the present embodiment, the light emitting panels 2A to 2C share the light emitting layer 13 and the cathode 14. Thus, the configuration of the illumination device 100C is simplified.

Fifth Embodiment

[Overview]

The illumination device 100C according to the fourth embodiment was composed of a plurality of anodes 12, one light-emitting layer 13, and one cathode 14. On the other hand, the illumination device 100D according to the fifth embodiment includes a plurality of anodes 12, a plurality of light-emitting layers 13, and a plurality of cathodes 14.

Other points of the illumination device 100D according to the fifth embodiment are the same as those of the illumination device 100C according to the fourth embodiment, so that the description thereof will not be repeated below.

[Illumination Device 100D]

Figure 18:
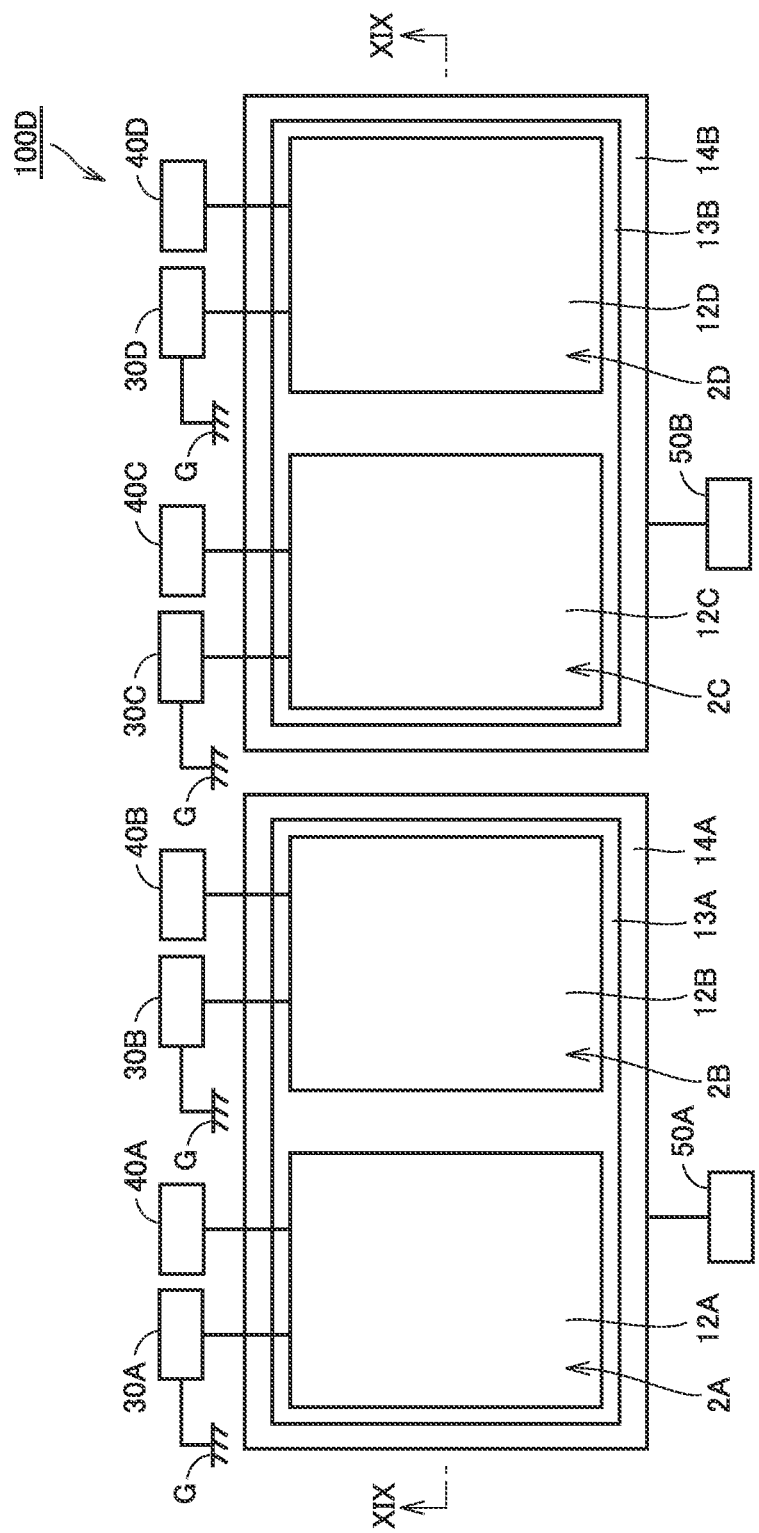
FIG. 18 is a plan view showing an illumination device according to a fifth embodiment.
Figure 19:
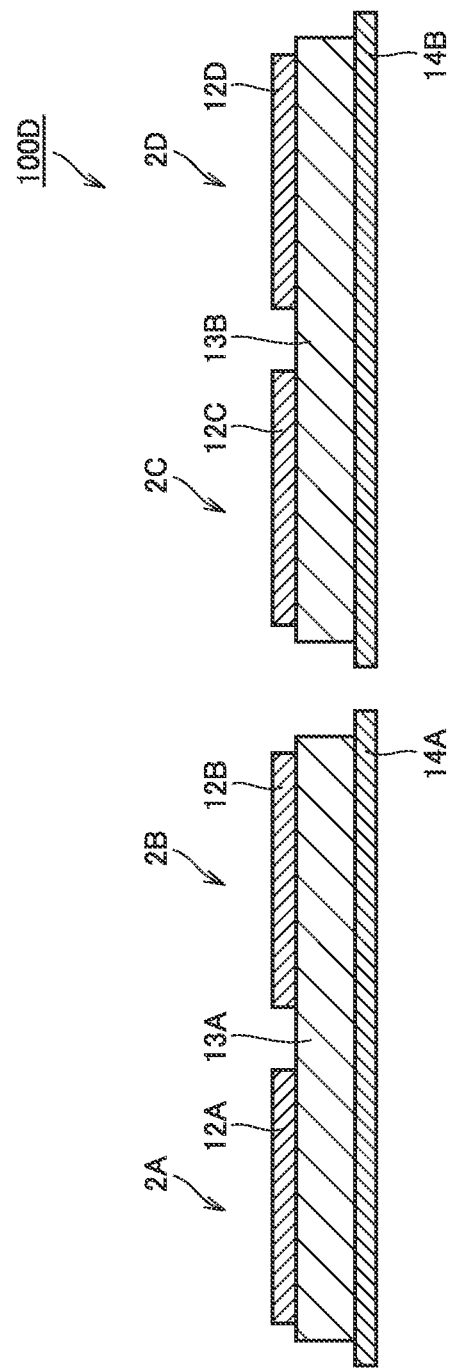
FIG. 19 is a cross-sectional view taken along the line XIX-XIX in FIG. 18.

With reference to FIGS. 18 and 19, the illumination device 100D according to the fifth embodiment will be described. FIG. 18 is a plan view showing the illumination device 100D.

FIG. 19 is a cross-sectional view taken along the line XIX-XIX in FIG. 18. For ease of understanding, in FIGS. 18 and 19, the metal layer 11, the sealing member 15, the insulating layer 16, and the transmitting member 19 shown in FIG. 2 are omitted.

The illumination device 100D includes the light emitting panels 2A to 2D. The light emitting panel 2A is configured by a planar anode 12A, a light emitting layer 13A, and a planar cathode 14A. The light emitting panel 2B is configured by a planar anode 12B, a light emitting layer 13A, and a planar cathode 14A. The light emitting panel 2C is configured by a planar anode 12C, a light emitting layer 13B, and a planar cathode 14B. The light emitting panel 2D is configured by a planar anode 12D, a light emitting layer 13B, and a planar cathode 14B. As described above, the light-emitting panels 2A and 2B share the light-emitting layer 13A and the cathode 14A, and the light emitting panels 2C and 2D share the light emitting layer 13B and the cathode 14B.

The power supplies 30A to 30D are constant current sources. The power source 30A is connected to the anode 12A and the ground G, and supplies a current to the light emitting layer 13A disposed between the anode 12A and the cathode 14A. The power source 30B is connected to the anode 12B and the ground G. and supplies a current to the light emitting layer 13A disposed between the anode 12B and the cathode 14A. The power source 30C is connected to the anode 12C and the ground G. and supplies a current to the light emitting layer 13B disposed between the anode 12C and the cathode 14B. The power source 30D is connected to the anode 12D and the ground G, and supplies a current to the light emitting layer 13B disposed between the anode 12D and the cathode 14B.

The detection circuits 40A to 40D are sensors for detecting the touch operation by the user. The detection circuit 40A is electrically connected to the anode 12A, and detects a change in electrostatic capacitance of the illumination device 100D caused by a touch operation. The detection circuit 40B is electrically connected to the anode 12B, and detects a change in electrostatic capacitance of the illumination device 100D caused by a touch operation. The detection circuit 40C is electrically connected to the anode 12C, and detects a change in the electrostatic capacitance of the illumination device 100D caused by a touch operation. The detection circuit 40D is electrically connected to the anode 12D, and detects a change in the electrostatic capacitance of the illumination device 100D caused by a touch operation.

The detection circuits 50A and 50B are sensors for detecting proximity of the user. The detection circuit 50A is electrically connected to the cathode 14A, and detects a change in electrostatic capacitance of the illumination device 100D caused by the proximity of the user. The detection circuit 50B is electrically connected to the cathode 14B, and detects a change in electrostatic capacitance of the illumination device 100D caused by the proximity of the user.

Summary of Fifth Embodiment

As described above, the illumination device 100D according to the present embodiment includes a plurality of cathodes and a plurality of detection circuits for proximity detection. Each of the plurality of detection circuits for proximity detection is electrically connected to each of the plurality of cathodes. Thereby, the illumination device 100D can change the light emission mode according to the approaching direction of the user.

Sixth Embodiment

[Overview]

In the illumination device 100A according to the second embodiment, the detection circuits 40A to 40C detect a touch operation on each of the light emitting panels 2A to 2C. On the other hand, the illumination device 100E according to the sixth embodiment detects a touch operation on each of the light emitting panels 2A to 2C with one detection circuit 40.

Other points of the illumination device 100E according to the sixth embodiment are the same as the illumination device 100A according to the second embodiment, so that the description thereof will not be repeated below.

[Touch Detection Function and Proximity Detection Function]

Figure 20:
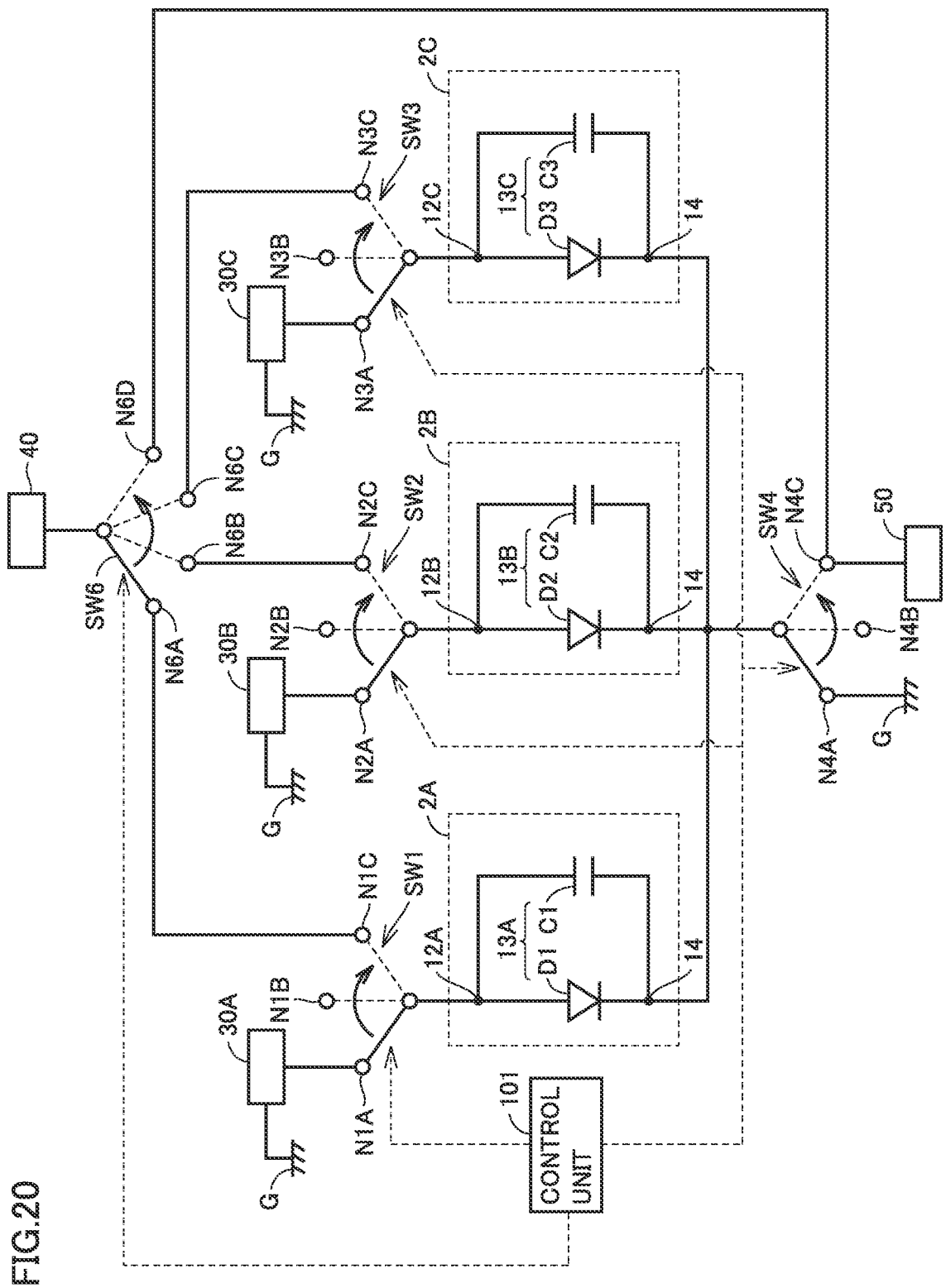
FIG. 20 is a diagram showing an example of a circuit configuration of an illumination device according to a sixth embodiment.
Figure 21:
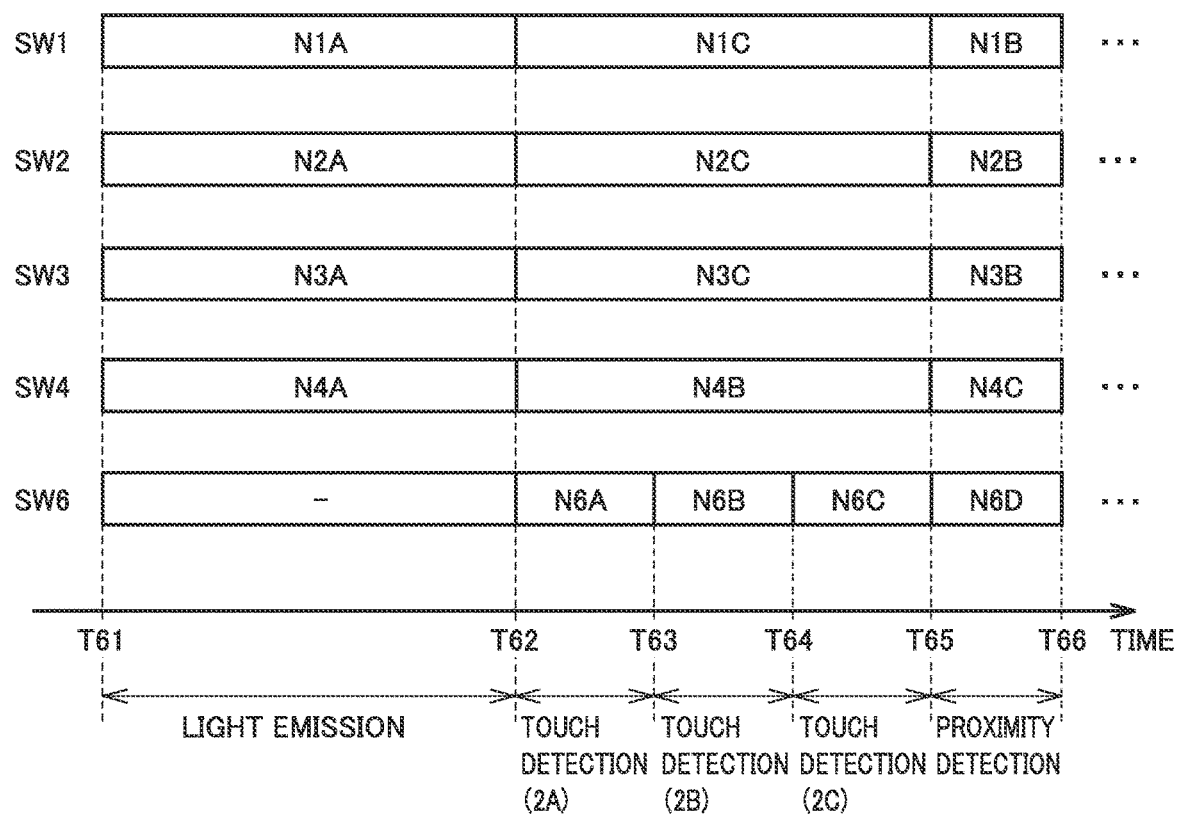
FIG. 21 is a diagram showing an example of a control sequence of an illumination device according to a sixth embodiment.

With reference to FIG. 20 and FIG. 21, the touch detection function and the proximity detection function in the illumination device 100E will be described. FIG. 20 is a diagram showing an example of a circuit configuration of the illumination device 100E.

The illumination device 100E includes one detection circuit 40. The detection circuit 40 is connected to the switch SW6. The contact N6A of the switch SW6 is connected to the contact N1C of the switch SW1. The contact N6B of the switch SW6 is connected to the contact N2C of the switch SW2. The contact N6C of the switch SW6 is connected to the contact N3C of the switch SW3. The contact N6C of the switch SW6 is connected to the contact N4D of the switch SW4.

FIG. 21 is a diagram showing an example of a control sequence of the illumination device 100E according to the sixth embodiment.

It is assumed that a light emission period has arrived at time T61. During the light emission period, the control unit 101 connects the switch SW1 to the contact N1A, connects the switch SW2 to the contact N2A, connects the switch SW3 to the contact N3A, and connects the switch SW4 to the contact N4A. As a result, the light emitting panels 2A to 2C emit light. At this time, the switch SW6 may be connected to any of the contacts N6A to N6D.

It is assumed that a touch sensing period for the light emitting panel 2A has arrived at time T62. In the touch sensing period, the control unit 101 connects the switch SW1 to the contact N1C, connects the switch SW2 to the contact N2C, connects the switch SW3 to the contact N3C, connects the switch SW4 to the contact N4B, connects the switch SW6 to the contact N6A. As a result, the detection circuit 40 for touch detection is connected to the anode 12A of the light emitting panel 2A. At this time, when the finger of the user approaches the light emitting panel 2A, an electrostatic capacitance is generated between the finger and the anode 12A. The detection circuit 40 detects a touch operation on the light emitting panel 2A based on the fact that the electrostatic capacitance between the finger and the anode 12A changes by a predetermined amount or more.

At time T63, it is assumed that a touch sensing period for the light emitting panel 2B has arrived. In the touch sensing period, the control unit 101 connects the switch SW6 to the contact N6B, and maintains the current state of the switches SW1 to SW4. As a result, the detection circuit 40 for touch detection is connected to the anode 12B of the light emitting panel 2B. At this time, when the user's finger approaches the light emitting panel 2B, an electrostatic capacitance is generated between the finger and the anode 12B. The detection circuit 40 detects a touch operation on the light emitting panel 2B based on the fact that the electrostatic capacitance between the finger and the anode 12B changes by a predetermined amount or more.

It is assumed that the touch sensing period for the light emitting panel 2C arrives at time T64. In the touch sensing period, the control unit 101 connects the switch SW6 to the contact N6C and maintains the current state of the switches SW to SW4. As a result, the detection circuit 40 for touch detection is connected to the anode 12C of the light emitting panel 2C. At this time, when the finger of the user approaches the light emitting panel 2C, an electrostatic capacitance is generated between the finger and the anode 12C. The detection circuit 40 detects a touch operation on the light emitting panel 2C based on the fact that the electrostatic capacitance between the finger and the anode 12C has changed by a predetermined amount or more.

It is assumed that the proximity sensing period has arrived at time T65. In the proximity sensing period, the control unit 101 connects the switch SW1 to the contact N1B, connects the switch SW2 to the contact N2B, connects the switch SW3 to the contact N3B, connects the switch SW4 to the contact N4C, connects the switch SW6 to the contact to N6D. As a result, the detection circuit 50 for proximity detection is connected to the common cathode 14. At this time, when the finger of the user approaches the light emitting panels 2A to 2C, an electrostatic capacitance is generated between the finger and the cathode. The detection circuit 50 detects proximity to the light emitting panels 2A to 2C based on the fact that the electrostatic capacitance between the finger and the cathode 14 has changed by a predetermined amount or more.

In the proximity sensing period, the control unit 101 sets the sensitivity at the time of proximity detection higher than the sensitivity at the touch detection by connecting the switch SW6 to the contact N6D. Such sensitivity switching may be realized by software control or by hardware control.

Summary of Sixth Embodiment

As described above, the illumination device 100E according to the present embodiment detects a touch operation on each of the light-emitting panels 2A to 2C with one detection circuit 40. This simplifies the configuration of the illumination device 100E and reduces the cost of the illumination device 100E.

CONCLUSION

According to one aspect, an illumination device comprises a planar first electrode, a planar second electrode arranged to face the first electrode, a light emitting layer which is disposed between the first electrode and the second electrode and emits light in accordance with a current flowing between the first electrode and the second electrode, a first detection unit that is electrically connected to the first electrode and detects an electrostatic capacitance of the first electrode, and a second detection unit electrically connected to the second electrode and detecting a capacitance of the second electrode.

Preferably, the first detection unit is a capacitance type touch sensor that detects a touch operation on the illumination device based on a change in electrostatic capacitance of the first electrode. The second detection unit is a capacitance type proximity sensor that detects proximity of the operating body to the illumination device based on a change in electrostatic capacitance of the second electrode.

Preferably, the area of the second electrode is larger than the area of the first electrode. Preferably, the illumination device comprises a control unit which sequentially switches to at least two of a light emission period of the light emitting layer, a sensing period of the touch operation by the first detection unit, and a proximate sensing period by the second detection unit.

Preferably, the illumination device comprises a power source which is electrically connected to the first electrode and the second electrode, and supplies current to the light emitting layer.

Preferably, a first switch is electrically connected to the first electrode, the first switch is capable to switch to any one of a state of electrically connecting the first electrode to the power source, a state of electrically connecting the first electrode to the first detection unit, and a state of electrically connecting the first electrode to a first contact in a state of a predetermined electric potential, a second switch is electrically connected to the second electrode, the second switch is capable to switch to any one of a state of electrically connecting the second electrode to a ground, a state of electrically connecting the second electrode to the second detection unit, and a state of electrically connecting the second electrode to a second contact in a state of a predetermined electric potential. The control unit switches the first switches to a state of electrically connecting the first electrode to the power source, and the second electrode to a state of electrically connecting to the ground, in the light emission period, the first switches to a state of electrically connecting the first electrode and the first detection unit and the second switch to a state of electrically connecting the second electrode to the second contact, in a sensing period of the touch operation, and the first switches to a state of connecting the first electrode to the first contact, and the second electrode is electrically connected to the second detection unit, in a proximate sensing period.

Preferably, the control unit sets the first electrode and the second electrode at the same electric potential in the sensing period of the touch operation.

Preferably, the control unit sets the first electrode and the second electrode at the same electric potential in the proximate sensing period.

Preferably, the control unit brings at least one of the first electrode and the second electrode into a floating state in the sensing period of the touch operation.

Preferably, the control unit brings at least one of the first electrode and the second electrode into a floating state in the proximate sensing period.

Preferably, the first detection unit is a capacitance type touch sensor that detects a touch operation on the illumination device based on a change in electrostatic capacitance of the first electrode. The second detection unit is a capacitance type touch sensor that detects a touch operation on the illumination device based on a change in electrostatic capacitance of the second electrode.

Preferably, the first detection unit is a capacitance type proximity sensor that detects proximity of the operation body to the illumination device based on a change in electrostatic capacitance of the first electrode. The second detection unit is a capacitive type proximity sensor that detects proximity of the operation body to the illumination device based on a change in electrostatic capacitance of the second electrode.

Preferably, the illumination device comprises a plurality of the first electrodes and a plurality of the first detection units. Each of the plurality of first detection units is electrically connected to each of the plurality of first electrodes respectively.

Preferably, the illumination device comprises a plurality of the second electrodes and a plurality of the second detection units. Each of the plurality of second detection units is electrically connected to each of the plurality of second electrodes respectively.

Preferably, an information processing apparatus including the illumination device is provided. The first electrode and the second electrode are arranged to face a casing of the information processing apparatus. A distance between the first electrode and the casing is shorter than a distance between the second electrode and the casing.

The embodiment disclosed this time is an example in all respects and should be considered to be not restrictive. The scope of the present invention is defined not by the description above but by the claims, and it is intended to include meanings equivalent to the claims and all modifications within the scope.

EXPLANATION OF SIGN 2, 2A to 2D light emitting panel, 11 metal layer, 12, 12A to 12D anode, 13, 13A to 13C light emitting layer, 14, 14A, 14B cathode, 15 sealing member, 16 insulating layer, 17, 18 connection terminal, 19 Transmitting member 30, 30A to 30 D power source 40, 40A to 40D, 50, 50A to 50C detection circuit, 100, 100A to 100E illumination device, 101 control unit, 118 operation button, 119 housing. 120 liquid crystal display. 200 information processing apparatus

The invention claimed is:
1. An illumination device comprising:
a planar first electrode;
a planar second electrode arranged to face the planar first electrode;
a light emitting layer which is disposed between the planar first electrode and the planar second electrode and emits light in accordance with a current flowing between the planar first electrode and the planar second electrode;
a first sensor that is electrically connected to the planar first electrode and detects an electrostatic capacitance of the planar first electrode; and
a second sensor that is electrically connected to the planar second electrode and detects an electrostatic capacitance of the planar second electrode.
2. The illumination device according to claim 1, wherein the first sensor is a capacitance type touch sensor that detects a touch operation on the illumination device based on a change in electrostatic capacitance of the planar first electrode, and
wherein the second sensor unit is a capacitance type proximity sensor that detects proximity of an operating body to the illumination device based on a change in electrostatic capacitance of the planar second electrode.

3. The illumination device according to claim 2, wherein an area of the planar second electrode is larger than an area of the planar first electrode.

4. The illumination device according to claim 2, wherein the illumination device comprises a controller which sequentially switches to at least two of a light emission period of the light emitting layer, a sensing period of the touch operation by the first sensor, and a proximate sensing period by the second sensor.

5. The illumination device according to claim 4, wherein the illumination device comprises a power source which is electrically connected to the planar first electrode and the planar second electrode, and supplies current to the light emitting layer.

6. The illumination device according to claim 5, wherein a first switch is electrically connected to the planar first electrode,
the first switch is capable to switch to any one of a state (A) of electrically connecting the planar first electrode to the power source, a state (B) of electrically connecting the planar first electrode to the first sensor, and a state (C) of electrically connecting the planar first electrode to a first contact in a state of a predetermined electric potential,
a second switch is electrically connected to the planar second electrode,
the second switch is capable to switch to any one of a state (D) of electrically connecting the planar second electrode to a ground, a state (E) of electrically connecting the planar second electrode to the second sensor, and a state (F) of electrically connecting the planar second electrode to a second contact in a state of a predetermined electric potential,
the controller switches:
  the first switch to the state (A) of electrically connecting the planar first electrode to the power source, and the second switch to the state (D) of electrically connecting the planar second electrode to the ground, in the light emission period;
  the first switch to the state (B) of electrically connecting the planar first electrode and the first sensor, and the second switch to the state (F) of electrically connecting the planar second electrode to the second contact, in the sensing period of the touch operation; and
  the first switch to the state (C) of connecting the planar first electrode to the first contact, and the second switch to the state (E) of electrically connecting the planar second electrode to the second sensor, in the proximate sensing period.

7. The illumination device according to claim 5, wherein the controller sets the planar first electrode and the planar second electrode at a same electric potential in the sensing period of the touch operation.

8. The illumination device according to claim 5, wherein the controller sets the planar first electrode and the planar second electrode at a same electric potential in the proximate sensing period.

9. The illumination device according to claim 5, wherein the controller brings at least one of the planar first electrode and the planar second electrode into a floating state in the sensing period of the touch operation.

10. The illumination device according to claim 5, wherein the controller brings at least one of the planar first electrode and the planar second electrode into a floating state in the proximate sensing period.

11. The illumination device according to claim 1, wherein the first sensor is a capacitance type touch sensor that detects a touch operation on the illumination device based on a change in electrostatic capacitance of the planar first electrode, and
wherein the second sensor is a capacitance type touch sensor that detects a touch operation on the illumination device based on a change in electrostatic capacitance of the planar second electrode.

12. The illumination device according to claim 1, wherein the first sensor is a capacitance type proximity sensor that detects proximity of an operation body to the illumination device based on a change in electrostatic capacitance of the planar first electrode, and
wherein the second sensor is a capacitive type proximity sensor that detects proximity of the operation body to the illumination device based on a change in electrostatic capacitance of the planar second electrode.

13. The illumination device according to claim 1, wherein the illumination device comprises a plurality of the planar first electrodes and a plurality of the first sensors, and
wherein each of the plurality of the first sensors is electrically connected to each of the plurality of the planar first electrodes respectively.

14. The illumination device according to claim 1, wherein the illumination device comprises a plurality of the planar second electrodes and a plurality of the second sensors, and
wherein each of the plurality of the second sensors is electrically connected to each of the plurality of the planar second electrodes respectively.

15. An information processing apparatus comprising the illumination device according to claim 1,
wherein the planar first electrode and the planar second electrode are arranged to face a casing of the information processing apparatus, and
a distance between the planar first electrode and the casing is shorter than a distance between the planar second electrode and the casing.

* * * * *